US012196907B2

(12) United States Patent
Tian et al.

(10) Patent No.: US 12,196,907 B2
(45) Date of Patent: Jan. 14, 2025

(54) INTELLIGENT REAL-TIME UPDATING METHOD AND SYSTEM FOR STRATIGRAPHIC FRAMEWORK WITH GEOSTEERING-WHILE-DRILLING

(71) Applicant: Institute of Geology and Geophysics, Chinese Academy of Sciences, Beijing (CN)

(72) Inventors: Fei Tian, Beijing (CN); Wenhao Zheng, Beijing (CN)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/895,088

(22) Filed: Aug. 25, 2022

(65) Prior Publication Data
US 2023/0333274 A1   Oct. 19, 2023

(30) Foreign Application Priority Data
Apr. 13, 2022   (CN) .......................... 202210385686.5

(51) Int. Cl.
*G01V 1/48*  (2006.01)
*G01V 1/36*  (2006.01)
(Continued)

(52) U.S. Cl.
CPC .................. *G01V 1/48* (2013.01); *G01V 1/36* (2013.01); *E21B 44/00* (2013.01); *E21B 47/00* (2013.01);
(Continued)

(58) Field of Classification Search
CPC . G01V 1/48; G01V 1/36; G01V 1/282; G01V 1/302; G01V 1/306; G01V 1/50;
(Continued)

(56) References Cited

U.S. PATENT DOCUMENTS 10,422,924 B2 *  9/2019  Zhang ...................... G01V 1/40
11,486,230 B2 * 11/2022  Tawil ..................... G06Q 50/02
(Continued)

FOREIGN PATENT DOCUMENTS

| CN | 105842736 A | 8/2016 |
| CN | 109387869 A | 2/2019 |
| CN | 112394392 A | 2/2021 |

OTHER PUBLICATIONS

Title of the Item: "Drilling& Production Technology" Publication date: Sep. 25, 2010 Name of the Author: Yan Zhenlai Title of the article:"Research and Application of CO2 Single Well Huff and Puff Enhanced Oil Recovery Technology" volume-issue numbers:vol. 33 No. 5.

(Continued)

*Primary Examiner* — Arleen M Vazquez
*Assistant Examiner* — Leonard S Liang
(74) *Attorney, Agent, or Firm* — Nitin Kaushik

(57) ABSTRACT

The present disclosure belongs to the field of geological prospecting and particularly relates to an intelligent real-time updating method and system for a stratigraphic framework with geosteering-while-drilling, aiming to solve the problems of insufficient precision in position and dipping angle of a stratigraphic framework due to differences in parameters measured by different instruments for well logging and mud logging while drilling. The method of the present disclosure comprises: obtaining existing well data, and acquiring well logging data and images imaged while-drilling in real time; constructing an initial stratigraphic framework model, eliminating abnormal values, and conducting dimensionality reduction; and based on dimensionality reduction well logging data, conducting non-linear clustering through a density peak clustering method, obtaining a marker layer primary prediction result through a marker layer prediction model of a depth belief network and (Continued)

conducting correction, to obtain a corrected stratigraphic framework model and to adjust a drilling trajectory.

5 Claims, 17 Drawing Sheets

(51) Int. Cl.

| | |
|---|---|
| E21B 44/00 | (2006.01) |
| E21B 47/00 | (2012.01) |
| E21B 49/00 | (2006.01) |
| G01V 1/28 | (2006.01) |
| G01V 1/30 | (2006.01) |
| G01V 1/50 | (2006.01) |
| G01V 11/00 | (2006.01) |
| G01V 20/00 | (2024.01) |
| G06F 30/27 | (2020.01) |
| G06N 3/04 | (2023.01) |
| G06N 3/08 | (2023.01) |
| G06T 7/00 | (2017.01) |
| G06T 17/05 | (2011.01) |
| G06V 10/74 | (2022.01) |
| G06V 10/762 | (2022.01) |
| G06V 10/82 | (2022.01) |

(52) U.S. Cl.
CPC .............. *E21B 49/00* (2013.01); *G01V 1/282* (2013.01); *G01V 1/302* (2013.01); *G01V 1/306* (2013.01); *G01V 1/50* (2013.01); *G01V 11/00* (2013.01); *G01V 20/00* (2024.01); *G01V 2200/16* (2013.01); *G06F 30/27* (2020.01); *G06N 3/04* (2013.01); *G06N 3/08* (2013.01); *G06T 7/00* (2013.01); *G06T 17/05* (2013.01); *G06V 10/74* (2022.01); *G06V 10/762* (2022.01); *G06V 10/82* (2022.01)

(58) Field of Classification Search
CPC .... G01V 11/00; G01V 20/00; G01V 2200/16; E21B 44/00; E21B 47/00; E21B 49/00; E21B 7/04; E21B 2200/20; E21B 2200/22; G06F 30/27; G06F 18/22; G06F 18/2321; G06N 3/04; G06N 3/08; G06N 3/045; G06N 3/084; G06T 7/00; G06T 17/05; G06T 7/0004; G06V 10/74; G06V 10/762; G06V 10/82
See application file for complete search history.

(56) References Cited

U.S. PATENT DOCUMENTS

| | | | |
|---|---|---|---|
| 2013/0080058 A1 | 3/2013 | Wu et al. | |
| 2019/0331812 A1* | 10/2019 | Liu | G01V 20/00 |
| 2020/0167914 A1* | 5/2020 | Stamatoyannopoulos | G16B 40/30 |
| 2020/0248545 A1* | 8/2020 | Maus | E21B 47/09 |
| 2021/0247534 A1* | 8/2021 | Bø | G06N 3/08 |
| 2022/0114302 A1* | 4/2022 | Skripkin | G06F 30/20 |
| 2022/0187496 A1* | 6/2022 | Mishchenko | G06T 17/20 |
| 2022/0351037 A1* | 11/2022 | Li | G01N 1/08 |
| 2023/0017966 A1* | 1/2023 | Skoff | E21B 44/00 |
| 2024/0127039 A1* | 4/2024 | Sheoran | G06N 3/045 |

OTHER PUBLICATIONS

Title of the Item: " Acta Petrolei Sinica" Publication date: Mar. 25, 2004 Name of the Author: Xia Hongquan et al. Title of the article:"Real-time recognizing method of lithology based on information while drilling" volume-issue numbers:vol. 25 No. 2.

* cited by examiner

INTELLIGENT REAL-TIME UPDATING METHOD AND SYSTEM FOR STRATIGRAPHIC FRAMEWORK WITH GEOSTEERING-WHILE-DRILLING

CROSS-REFERENCE TO RELATED APPLICATIONS

The application claims priority to Chinese patent application No. 202210385686.5, filed on Apr. 13, 2022, the entire contents of which are incorporated herein by reference.

TECHNICAL FIELD

The present disclosure belongs to the field of geological prospecting and particularly relates to an intelligent real-time updating method and system for a stratigraphic framework with geosteering-while-drilling.

BACKGROUND

Compared with common vertical wells and directional wells in the petroleum industry, horizontal wells have the characteristics of a high producing degree of reserves, high single-well output, low oil production cost, and the like. In the drilling process of the horizontal wells, the success rate and the drilling catching rate are mainly controlled by well trajectories controlled by geosteering in real time. In the geosteering process, it has become a key to improving the drilling catching rate of reservoirs that geologic framework models are adjusted according to real-time data obtained by drilling catching under the wells. In the actual drilling process, directional drilling engineers and drilling engineers establish an initial stratigraphic framework model in modes of earthquakes, well logging, and the like, update the geologic framework model in combination with well logging data while drilling, drilling data, and mud logging data to judge a stratum, at which a drill bit is located, in real time and optimizes the well trajectory to ensure the optimal position of a horizontal section in the reservoir, which has an important significance of increasing the drilling catching rate of the reservoir and oil and gas production of the horizontal well.

Due to the complexity and the versatility of geological objects faced by geosteering-while-drilling, it requires that the drill bit can accurately drill into a stratum with a fluctuation of about 1 m, which makes the conventional stratigraphic framework updating technology confronted with a great challenge and results in many technical problems. An optimal solution cannot be obtained often depending on judgment with personal experiences of the directional well engineers. For example, an actual stratum depth in a while-drilling range is not matched with a seismic section depth, which results in a large difference between an actual drilling result and a design. Once penetrating out of the top boundary and the bottom boundary of the reservoir, the drill bit can return a case at a target section only requiring adjustment on a long well section. When the situation is severe, it requires sidetracking and even drilling finishing in advance; or there is a fault in the drilling process suddenly, or a stratum is of a complex structure, and the next drilling direction of the drill bit cannot be determined. How to accurately align with the stratigraphic framework model in real time to conduct correction in depth, dipping angle, and dipping direction of the stratum and how to recognize a fracture in real time are keys for updating the stratigraphic framework model in real time. Strata for complex oil and gas reservoir drilling have common problems of heterogeneity and great differences in parameters measured by various instruments for well logging and mud logging while drilling, and how to merge various types of geological-geophysical data to achieve integrated cooperation is a great problem.

SUMMARY

To solve the above problems in the prior art (that is, the common problems of heterogeneity and great differences in parameters measured by different instruments for well logging and mud logging while drilling which cannot be well overcome in the existing drilling technology) and the problems of poor control effect on well trajectory due to insufficient precision in position and dipping angle recognition of a stratigraphic framework, the present disclosure proposes an intelligent real-time updating method for a stratigraphic framework with geosteering-while-drilling. The method comprises:

Step S100, obtaining existing well data and acquiring well logging data and images imaged while-drilling in real time;

Step S200, based on the existing well data, constructing an initial stratigraphic framework model;

Step S300, based on the well logging data, conducting preprocessing of eliminating abnormal values to obtain effective well logging data;

Step S400, based on the effective well logging data, conducting non-linear dimensionality reduction to obtain dimensionality reduction well logging data;

Step S500, based on the dimensionality reduction well logging data, conducting non-linear clustering through a density peak clustering method, and conducting interactive quantitative evaluation in combination with cores and well logging with imaging-while-drilling to obtain a labeled well logging data cluster;

Step S600, based on the well logging data cluster, obtaining a marker layer primary prediction result through a marker layer prediction model based on a deep belief network;

Step S700, conducting depth correction and dipping angle and dipping direction correction on the stratigraphic framework model through the marker layer primary prediction result to obtain a corrected stratigraphic framework model and to adjust a drilling trajectory according to the corrected stratigraphic framework model.

In some preferable implementation manners, in the step S300, the abnormal values are eliminated through the isolated forest algorithm, especially comprising:

Step S310, selecting 10 kinds of well logging data and drilling data, wherein the well logging data includes AC, CNL, RD, RS, COND, GR, and DEN, and the drilling data includes a drilling rate, a rotating speed, and a drilling pressure; and selecting the well logging data and the drilling data for permutation and combination to establish to-be-processed data sets;

Step S320, representing a to-be-processed data combination in each to-be-processed data set as $X=\{x_1, \ldots, x_i, \ldots, x_n\}$, $1 \leq i \leq n$, $\forall x_i \in X$, $x_i=(x_{i1}, \ldots, x_{i10})$, wherein $x_i$ represents data points, and randomly drawing $\varphi$ data points from the well logging data X to constitute a subset X' to be stored in a root node;

step S330, randomly selecting a dimension q from the well logging data, and randomly generating a cut point p in the dimension q, wherein the cut point p satisfies min $(x_{ij}, j=q, x_{ij} \in X') < p < \max(x_{ij}, j=q, x_{ij} \in X')$;

Step S340, generating hyperplanes for dividing data in the dimension q into two subspaces according to the cut point p, designating data points with values smaller than p to be put into a first leaf node, and designating data points with values larger than or equal to p to be put into a second leaf node;

Step S350, recurring methods in steps S330-S340 until all leaf nodes have one data point or an isolated tree has already reached a preset height;

Step S360, repeating the methods in the steps S320-S350 until T isolated trees are generated, wherein T isolated trees represent: the isolated trees do not have outside nodes of leaf nodes or have two leaf nodes $\{T_l, T_r\}$ and one inside node test; the inside node test in the T isolated trees is composed of the dimension q and one cut point p, and points belong to $T_l$ if q<p, or otherwise belongs to $T_r$;

Step S370, enabling the T isolated trees to be an isolated tree forest; enabling each data point $x_i$ to traverse each isolated tree, and calculate a height $h(x_i)$ of each data point $x_i$ at each isolated tree, that is, the number of the edges passed by each data point $x_i$ from the root nodes to the leaf nodes of each isolated tree; and then calculating the average height of each data point $x_i$ in the isolated tree forest, and normalizing the average heights of all the data points to obtain a normalized average height $\overline{h(x_i)}$ of the data points;

Step S380, based on the normalized average height of data points $\overline{h(x_i)}$, calculating an abnormal value score $s(x, \varphi)$:

$$s(x, \varphi) = 2^{-\frac{E(\overline{h(x_i)})}{\overline{c(\varphi)}}}$$

wherein $\overline{c(\varphi)}$ represents an average of a binary tree path length constructed by $\varphi$ data points, and $E(*)$ represents expectation;

$$\overline{c(\varphi)} = \begin{cases} 2H(\varphi-1) - \frac{2(\varphi-1)}{\varphi}, & \varphi > 2 \\ 1, & \varphi = 2 \\ 0, & \varphi < 2 \end{cases}$$

wherein H(i) represents a harmonic number and is estimated by ln(i)+0.5772156649, and 0.5772156649 is an Euler's constant;

when the abnormal value score $s(x, \varphi)$ is smaller than a preset abnormal value threshold s, a corresponding data point is eliminated to obtain effective well logging data $Y=\{y_1, \ldots, y_\alpha, \ldots, y_m\}$, $1 \le \alpha \le m$ and $y_\alpha \in Y$, and m represents the number of the data points in the effective well logging data.

Step S390, repeating the methods in the steps S320-380 to select a to-be-processed data combination which is never selected for calculation of effective well logging data, and selecting the effective well logging data with the accuracy rate reaching a first preset accuracy rate threshold and with the highest accuracy rate to conduct a subsequent step.

In some preferred implementation manners, non-linear dimensionality reduction is conducted on the effective well logging data by using t-SNE method, specifically comprising:

Step S410, based on the effective well logging data $Y=\{y_1, \ldots, y_\alpha, \ldots, y_m\}$, selecting arbitrary points $y_\alpha$ and $y_\beta$, $1 \le \alpha, \beta \le m$, $y_\alpha, y_\beta \in Y$, wherein $y_\beta$ obeys Gaussian distribution $P_\alpha$ with $y_\alpha$ as a center and $\sigma_\beta$ as a variance, $y_\alpha$ obeys Gaussian distribution $P_\beta$ with $y_\beta$ as a center and $\sigma_\alpha$ as a variance, and then the similar conditional probability $P_{\beta|\alpha}$ between $y_\alpha$ and $y_\beta$ is as follows:

$$P_{\beta|\alpha} = \frac{\exp(-\|y_\alpha - y_\beta\|^2/2\sigma_\alpha^2)}{\sum_{a \ne b}\exp(-\|y_a - y_b\|^2/2\sigma_\alpha^2)}$$

wherein a user may designate perplexity Perp according to $\sigma_\alpha$, the perplexity is defined as $\text{Perp}(P_\alpha)=2^{H(P_\alpha)}$, and $H(P_\alpha)$ represents a Shannon information entropy of Gaussian distribution $P_\alpha$:

$$H(P_\alpha) = -\sum_\beta P_{\beta|\alpha} \log_2 p_{\beta|\alpha}$$

the joint probability $P_{\alpha\beta}$ of pairwise similarity for similar conditional probability between the data points $y_\alpha$ and $y_\beta$ in all the data points is as follows:

$$p_{\alpha\beta} = \frac{p_{\beta|\alpha} + p_{\alpha|\beta}}{2m}$$

wherein $p_{\alpha|\beta}$ represents the similar conditional probability between $y_\beta$ and $y_\alpha$;

Step S420, assuming that a dimensionality reduction well logging data set $Z=\{z_1, \ldots, z_\alpha, \ldots, z_m\}$ is constructed based on the effective well logging data $Y=\{y_1, \ldots, y_\alpha, \ldots, y_m\}$, wherein in the step S420, the effective well logging data is data in a high-dimensional space relatively to the dimensionality reduction well logging data set; and calculating the joint probability $q_{\alpha\beta}$ of corresponding simulation points $z_\alpha$ and $z_\beta$ of data points $y_\alpha$ and $y_\beta$ in the dimensionality reduction well logging data set:

$$q_{\alpha\beta} = \frac{(1+\|z_\alpha - z_\beta\|^2)^{-1}}{\sum_{\varepsilon 1 \ne \varepsilon 2}(1+\|z_{\varepsilon 1} - z_{\varepsilon 2}\|^2)^{-1}}$$

wherein $1 \le \varepsilon 1, \varepsilon 2 \le m$, $z_{\varepsilon 1}$ and $z_{\varepsilon 2}$ represent two different points in the dimensionality reduction well logging data set, $z_{\varepsilon 1}, z_{\varepsilon 2} \in Z$, and calculation of each joint probability $q_{\alpha\beta}$ traverses all two different points in the dimensionality reduction well logging data set;

Step S430, based on the joint probability $P_{\alpha\beta}$ of pairwise similarity for similar conditional probability between the data points $y_\alpha$ and $y_\beta$ in all the data points and the joint probability $q_{\alpha\beta}$ of the corresponding simulation points $z_\alpha$ and $z_\beta$ of the data points $y_\alpha$ and $y_\beta$ in the dimensionality reduction well logging data set, measuring the similarity C between probability distribution Q of the dimensionality reduction well logging data set and probability distribution P of the high-dimensional space of the effective well logging data through KL divergence:

$$C = KL(P\|Q) = \sum_\alpha \sum_\beta p_{\alpha\beta} \log \frac{p_{\alpha\beta}}{q_{\alpha\beta}}$$

wherein the smaller the value of the similarity C is, the higher the simulation correctness of the simulation points of the dimensionality reduction well logging data set is;

the KL divergence takes a minimum value through a gradient-descent algorithm:

$$\frac{\delta C}{\delta z_\alpha} = 4\sum_\beta (p_{\alpha\beta} - q_{\alpha\beta})(z_\alpha - z_\beta)\left(1 + \|z_\alpha - z_\beta\|^2\right)^{-1}$$

a dimensionality reduction well logging data set is obtained $Z=\{z_1, \ldots, z_\alpha, \ldots, z_m\}$;

previous two dimensions in the dimensionality reduction well logging data set are kept, and the rest dimensions are deleted to obtain dimensionality reduction well logging data $\hat{Z}=\{\hat{z}_1, \ldots, \hat{z}_\alpha, \hat{z}_m\}$.

In some preferred implementation manners, the step S500 specifically comprises:

Step S510, calculating Euclidean distances $d_{\alpha\beta}$ between all data points in the dimensionality reduction well logging data:

$$d_{\alpha\beta} = d[(\hat{z}_{\alpha 1}, \hat{z}_{\alpha 2}), (\hat{z}_{\beta 1}, \hat{z}_{\beta 2})] = \left(\sum_{e=1}^{2} |\hat{z}_{\alpha e} - \hat{z}_{\beta e}|^2\right)^{1/2}$$

Step S520, according to the demand on the clustering number, setting a cutoff distance dc, wherein e represents a dimension of the dimensionality reduction well logging data.

Step S530, calculating a density $\rho_\alpha$ of each node based on the cutoff distance:

$$\rho_\alpha = \sum_{\beta \neq \alpha} e^{-\left(\frac{d_{\alpha\beta}}{dc}\right)^2}$$

wherein $\rho_\alpha$ means the number of nodes with a distance from the node i smaller than dc; and as strata at the same horizon embody strong similarity at the level of geophysical data, according to the set cutoff distance dc, the number of data points in this range is calculated. However, due to the employment of 0-1 functions, a discrete value may occur in density calculation; and to avoid this situation from affecting the effect of an algorithm, the present disclosure employs Gaussian kernel calculation.

Step S540, calculating a relative distance $\delta_\alpha$ between the nodes:

$$\delta_\alpha = \begin{cases} \max(d_{\alpha\beta}), & \rho_\alpha > \rho_\beta \\ \min(d_{\alpha\beta}), & \rho_\alpha \leq \rho_\beta \end{cases}$$

Step S550, with the density $\rho_\alpha$ as an abscissa and the relative distance $\delta_\alpha$ as an ordinate, drawing a two-dimensional diagram, determining a point in the clustering center, and grouping all the data points into the closest data points with a density larger than those of the above data points to obtain a well logging data cluster.

Step S560, based on the well logging data cluster, through a feature chart based on marker layers, conducting an interactive quantitative evaluation on the well logging data cluster by applying a core and images with imaging-while-drilling at a corresponding depth, to obtain a labeled well logging data cluster.

In some preferred implementation manners, before obtaining the marker layer primary prediction result through the marker layer prediction model based on the deep belief network, step S600 further comprises the step of selecting feature combination, especially comprising:

Step A100, processing and verifying well logging data through the method as in the steps S100-S500 to obtain well logging data clusters.

Step A200, numbering clusters belonging to a marker layer 1, and arbitrarily combining various clusters in the well logging data cluster, wherein a combination number of the clusters belonging to the marker layer 1 is:

$$C1 = C_g^1 + C_g^2 + \ldots + C_g^g$$

combinations of clusters belonging to a marker layer 2 and a marker layer 3 are C2 and C3.

Step A300, inputting all cluster combinations into the deep belief network as monitoring data, and calculating and verifying the accuracy rate A and the accuracy rate P of recognition of the marker layers of the well logging data:

$$A = \frac{TP + TN}{TN + FN + TP + FP}$$

$$P = \frac{TP}{TP + FP}$$

wherein TP represents that for a sample, the true category is positive, and the prediction category is also positive; FN represents that for the sample, the true category is positive, and the prediction category is negative; FP represents that for the sample, the true category is negative, and the prediction category is positive; and TN represents that for the sample, the true category is negative, and the prediction category is also negative.

Step A400, judging whether the accuracy rates of three marker layers in the marker layer primary prediction result are all larger than a preset second accuracy rate threshold or not; if the accuracy rates are not larger than the preset second accuracy rate threshold, selecting another group of cluster combination which is never selected; and if the accuracy rates are larger than the preset second accuracy rate threshold, calculating the group of cluster combination and the accuracy rate.

Step A500, repeating the methods in steps A300-A400 to calculate all primary prediction results that the accuracy rates are larger than the preset second accuracy rate threshold, selecting the primary prediction result with the highest accuracy rate, and taking a corresponding cluster combination thereto as a selected well logging data cluster and a deep belief network structure thereto as the marker layer prediction model based on the deep belief network.

In some preferred implementation manners, depth correction specifically comprises:

according to the marker layer primary prediction result, determining primary prediction positions of boundaries of the marker layers, and obtaining images with imaging-while-drilling containing the upper boundaries and the lower boundaries of the marker layers;

acquiring accurate depths of the upper boundaries and the lower boundaries of the marker layers from the images with imaging-while-drilling containing the upper boundaries and the lower boundaries of the marker layers through a fully convolutional neural network, and then conducting depth correction on the stratigraphic framework model.

In some preferred implementation manners, dipping angle and dipping direction correction specifically comprise:

based on a mapping relationship between the images with imaging-while-drilling and a dipping angle and a dipping direction of a stratum, calculating the dipping angle and the dipping direction of the stratum according to curvature and a peak value of an interface between marker layers, wherein a dipping angle α of the stratum relative to a drilled well is equal to $\text{Tan}^{-1}$ (lower peak depth-upper peak depth)/well diameter, and a dipping direction of the stratum relative to the drilled well is an orientation corresponding to a lower peak; and in combination with real-time dipping angle and dipping direction of drilling equipment, correcting the dipping angle and the dipping direction of the stratigraphic framework model.

In some preferred implementation manners, the method further comprises:

Step S800, based on the images with imaging-while-drilling, extracting a fracture image through a fracture image extraction model based on an optimized convolutional neural network, calculating the dipping angle and the dipping direction from the fracture image according to the curvature and the peak value of the interface between the marker layers, and adding the dipping angle and the dipping direction in the corrected stratigraphic framework model to obtain a perfect stratigraphic framework model, wherein the fracture image extraction model based on the optimized convolutional neural network is an n-channel image recognition network, comprising 2n convolutional layers and 2n average pooling layers; various channels are a first convolutional layer, a first average pooling layer, a second convolutional layer and a second average pooling layer which are connected with each other in sequence; scales of various convolutional layers are different; in the $f^{th}$ channel, the first convolutional layer is $(4*f-1)*(4*f-1)$, and the second convolutional layer is $(4*f+4)*(4*f+4)$; and the sizes of various pooling layers are the same, being $2*2$. One fully connected layer and one Naive Bayes decider are collectively connected after all the channels.

In some preferred implementation manners, the step S800 specifically comprises:

Step S810, based on the images with imaging-while-drilling, extracting different scales of fracture features through the first convolutional layers, the first average pooling layers, the second convolutional layers and the second average pooling layers of different channels of the fracture image extraction model based on the optimized convolutional neural network;

Step S820, combining different scales of fracture features into a comprehensive fracture feature through the fully connected layer;

Step S830, rapidly extracting a fracture image from the comprehensive fracture feature through the Naive Bayes decider;

Step S840, calculating the dipping angle and the dipping direction of the stratum according to curvature and a peak value of a fracture, wherein a dipping angle β of the fracture relative to the drilled well is equal to $\text{Tan}^{-1}$ (lower peak depth-upper peak depth)/well diameter, and a dipping direction of the fracture relative to the drilled well is an orientation corresponding to a lower peak; and in combination with real-time dipping angle and dipping direction of drilling equipment, correcting the dipping angle and the dipping direction of the fracture to obtain a corrected fracture image;

Step S850, adding the corrected fracture image in the corrected stratigraphic framework model to obtain the perfect stratigraphic framework model.

Another aspect of the present disclosure, provided is an intelligent real-time updating system for a stratigraphic framework with geosteering-while-drilling, comprising while-drilling information acquiring module, a stratigraphic framework model construction module, a data preprocessing module, a non-linear dimensionality reduction module, a well logging data clustering module, a primary prediction module, and an auxiliary correction module.

the while-drilling information acquiring module is configured to obtain existing well data and acquire well logging data and images imaged while drilling in real time;

the stratigraphic framework model construction module is configured to, based on the existing well data, construct an initial stratigraphic framework model;

the data preprocessing module is configured to, based on the well logging data, conduct preprocessing of eliminating abnormal values to obtain effective well logging data;

the non-linear dimensionality reduction module is configured to, based on the effective well logging data, conduct non-linear dimensionality reduction to obtain dimensionality reduction well logging data;

the well logging data clustering module is configured to, based on the dimensionality reduction well logging data, conduct non-linear clustering through a density peak clustering method to obtain well logging data clusters;

the primary prediction module is configured to, based on the well logging data cluster, obtain a marker layer primary prediction result through a marker layer prediction model based on a deep belief network;

the auxiliary correction module is configured to conduct depth correction and dipping angle and dipping direction correction on the stratigraphic framework model through the marker layer primary prediction result to obtain a corrected stratigraphic framework model and to adjust a drilling trajectory according to the corrected stratigraphic framework model.

The present disclosure has the beneficial effects that:

(1) In the intelligent real-time updating method for the stratigraphic framework with geosteering-while-drilling, by conducting non-linear dimensionality reduction on the measured data, in combination with the density peak clustering method, clusters that may affect the recognition precision are eliminated; thus a more accurate stratigraphic framework model is constructed for assisting to drilling.

(2) For the present disclosure, through the employed double-layer combination screening mechanism of a data set and a feature set, under double restraints of the core and imaging logging, a parameter and feature combination, is most effective to recognize the interface between strata, is preferably selected; and a real-time high-precision stratum recognition model is established.

(3) With correction in depth and dipping angle of the stratum, the present disclosure solves the problem of the depth precision in the drilling process and eliminates a depth error between a drill bit and the model. Particularly, in a sweet heart region such as a thin interbed with a thickness of a reservoir of about 1 m, a position of a target point can be effectively determined, and accurate drilling is implemented.

(4) The present disclosure extracts multi-dimension features of different types of fractures through 3 channels of different structures, and thus the effects of dissolution pores and pseudo-fractures are weakened. By considering real time while drilling, the decider of the convolutional neural network is adjusted, to avoid collapses of well walls caused by fractures and the effects on drilling due to non-correspondence between a stratum and a next stratum as much as possible.

BRIEF DESCRIPTION OF DRAWINGS

The other features, objects, and advantages of the present disclosure will become apparent by reading the detailed destinations made for non-restrictive embodiments concerning the drawings.

DETAILED DESCRIPTION OF THE EMBODIMENTS

Figure 1:
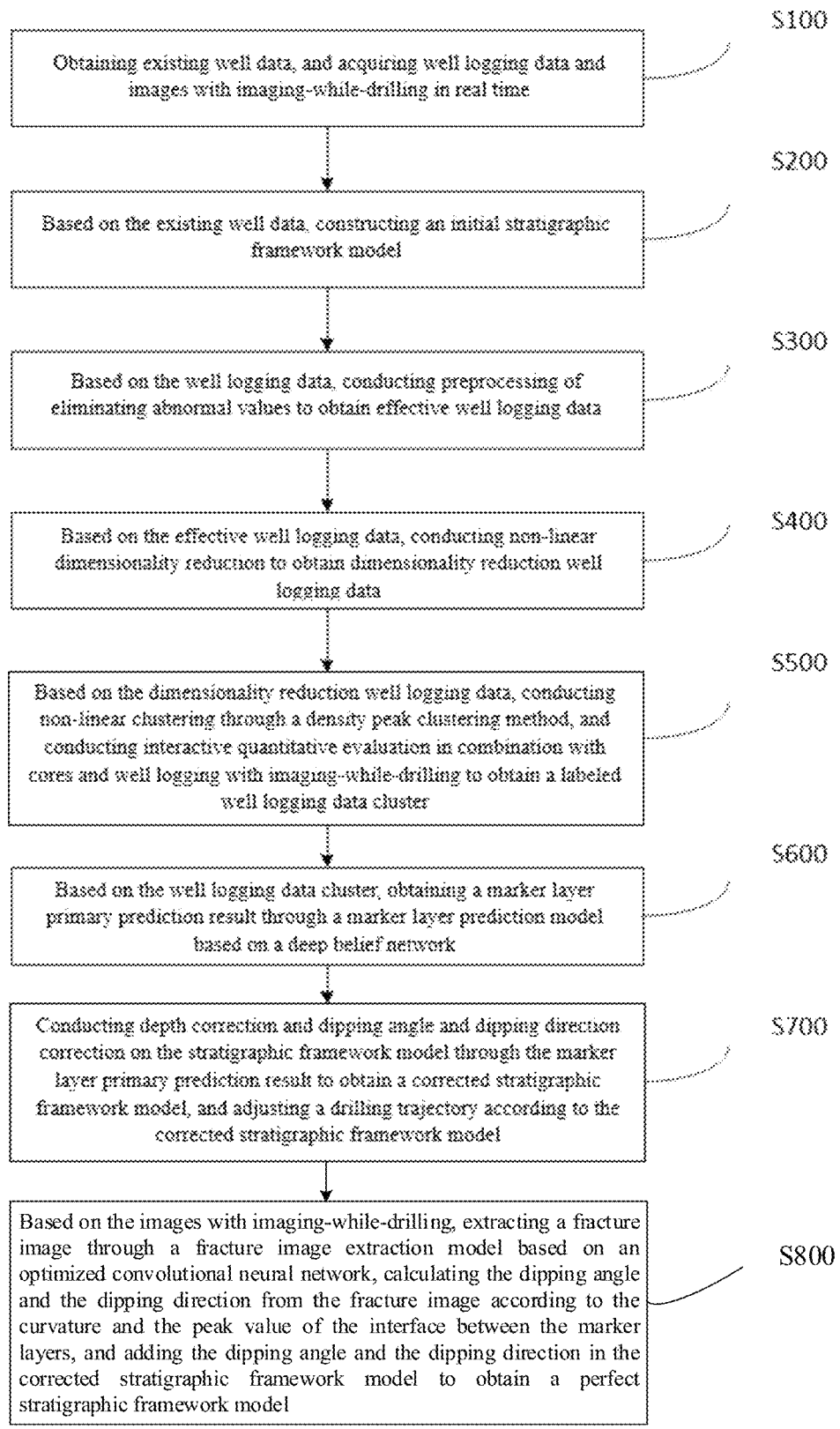
FIG. 1 is a flow chart of an intelligent real-time updating method for a stratigraphic framework with geosteering-while-drilling of the present disclosure.

The present disclosure is further described in detail hereinafter through a combination of the drawings and embodiments. It can be understood that the specific embodiments described here are only used for explaining related disclosures, rather than the limit to the present disclosure. Additionally, it also needs to be noted that to be convenient for description, relevant parts of the related disclosures are only shown in the drawings.

It needs to be noted that the embodiments in the present disclosure and the features in the embodiments can be combined under the condition of no conflict. The present disclosure is described in detail hereinafter with reference to the drawings and through combination with the embodiments.

The present disclosure provides an intelligent real-time updating method for a stratigraphic framework with geosteering-while-drilling, in which by conducting non-linear dimensionality reduction on the measured data, in combination with the density peak clustering method, clusters that may affect the recognition precision are eliminated, and thus a more accurate stratigraphic framework model is constructed for assisting to drilling.

The intelligent real-time updating method for the stratigraphic framework with geosteering-while-drilling comprises:

Step S100, obtaining existing well data, and acquiring well logging data and images imaged while-drilling in real time;

Step S200, based on the existing well data, constructing an initial stratigraphic framework model;

Step S300, based on the well logging data, conducting preprocessing of eliminating abnormal values to obtain effective well logging data;

Step S400, based on the effective well logging data, conducting non-linear dimensionality reduction to obtain dimensionality reduction well logging data;

Step S500, based on the dimensionality reduction well logging data, conducting non-linear clustering through a density peak clustering method to obtain well-logging data clusters;

Step S600, based on the well logging data cluster, obtaining a marker layer primary prediction result through a marker layer prediction model based on a deep belief network; and Step S700, conducting depth correction and dipping angle and dipping direction correction on the stratigraphic framework model through the marker layer primary prediction result to obtain a corrected stratigraphic framework model, and adjusting a drilling trajectory according to the corrected stratigraphic framework model.

In order to more clearly describe the system of the present disclosure, various steps in the embodiments of the present disclosure are described in detail in combination with FIG. 1 below.

An intelligent real-time updating method for a stratigraphic framework with geosteering-while-drilling according to embodiment 1 of the present disclosure, comprising:

Step S100, existing well data is obtained, and well logging data and images imaged while-drilling are acquired in real time.

According to prestack data, three-dimensional seismic processing technologies, including a special elastic impedance computing technology and an amplitude versus offset (AVO) analysis technology, is employed to obtain a seismic section; and a carbonate rock reservoir space mainly focuses on secondary pores, caves, and fractures. In general, a distinguishable karst cave (generally requiring the diameter of a corrosion zone to be larger than 35 m) exhibits features of a "string of beads" with strong reflection amplitude, small horizontal range, and obvious longitudinal difference on a post-stack seismic section and forms a "string-of-beads strong reflective" reservoir. The main mode of predicting a solution cave-type carbonate rock reservoir is to find a "string of beads" strong reflection according to post-stack data to determine an approximate range of the reservoir.

Figure 2:
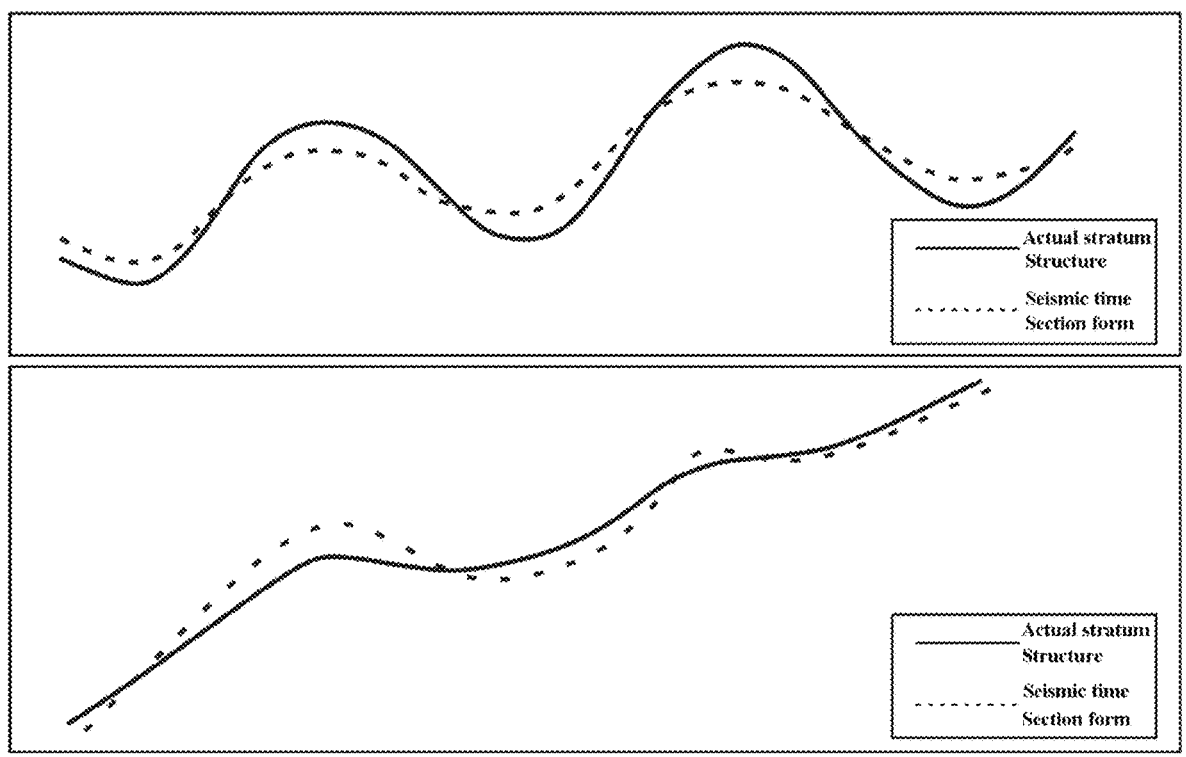
FIG. 2 is a comparative schematic diagram showing diagrams of an actual stratum structure versus a seismic time section form according to an embodiment of the present disclosure.

The key to solving the depth precision in the drilling process is to solve a depth error between a drill bit and the model. Particularly, in a sweet heart region such as a thin interbed with a thickness of a reservoir of about 1 m, the requirement on the depth in the drilling process is more sensitive. To solve the depth error problem, it requires to determine specific depths and dipping angles of 3 marker layers above the reservoir. To accurately recognize the marker layers and the reservoir in the process while drilling, in combination with previous geological information and well data, an initial feature chart of the reservoir and the 3 marker layers above the reservoir. Actual stratum structures and seismic time section forms are shown in FIG. 2. By predicting the marker layers through seismic times only, both the dipping angles and the depths have relatively large deviations, and the requirement of the drilling process for real time of judgment on a stratigraphic framework is difficult to solve.

Step S200, based on the existing well data, an initial stratigraphic framework model is constructed.

Figure 3:
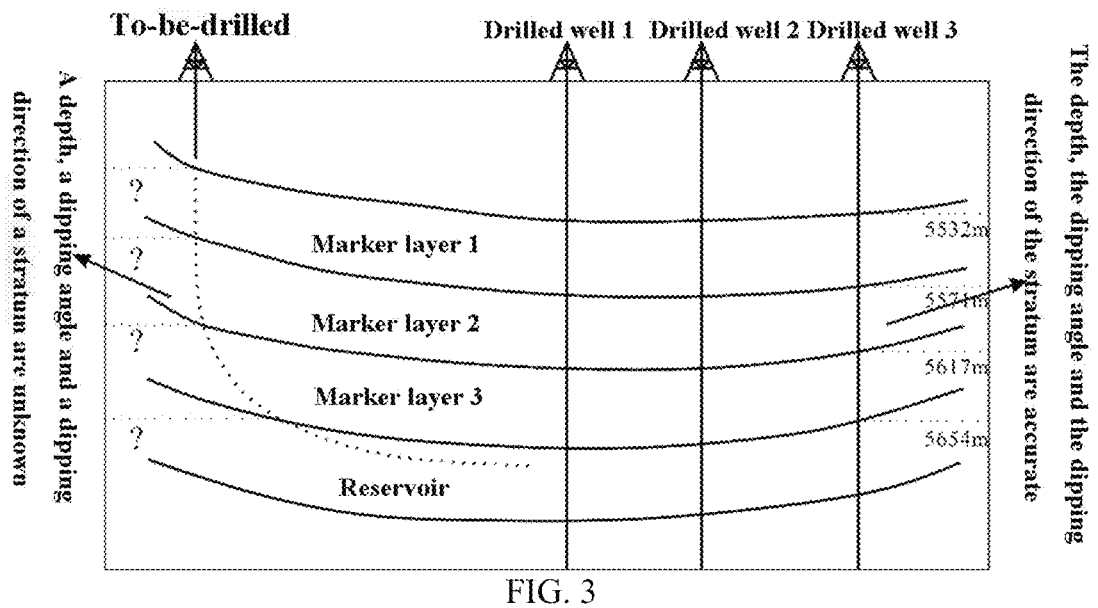
FIG. 3 is a schematic diagram of an initial stratigraphic framework model according to an embodiment of the present disclosure.

According to the marker layers and reservoir feature chart, a true depth range of marker layers and a reservoir in an existing vertical well is determined and calibrated with a depth in a seismic section, and the initial stratigraphic framework model, including a horizon, the lithology, the depth range and the dipping angle of the stratum, as shown in FIG. 3. In the initial stratigraphic framework model, the depth and the dipping angle of the stratum and the like near the existing vertical well have already been corrected, but a depth and a dipping angle of a to-be-drilled accessory have not been determined yet, which results in a deviation in a well trajectory. Therefore, measurement is required in the process while drilling, and the stratigraphic framework model can be recognized and updated in time.

Figure 4:
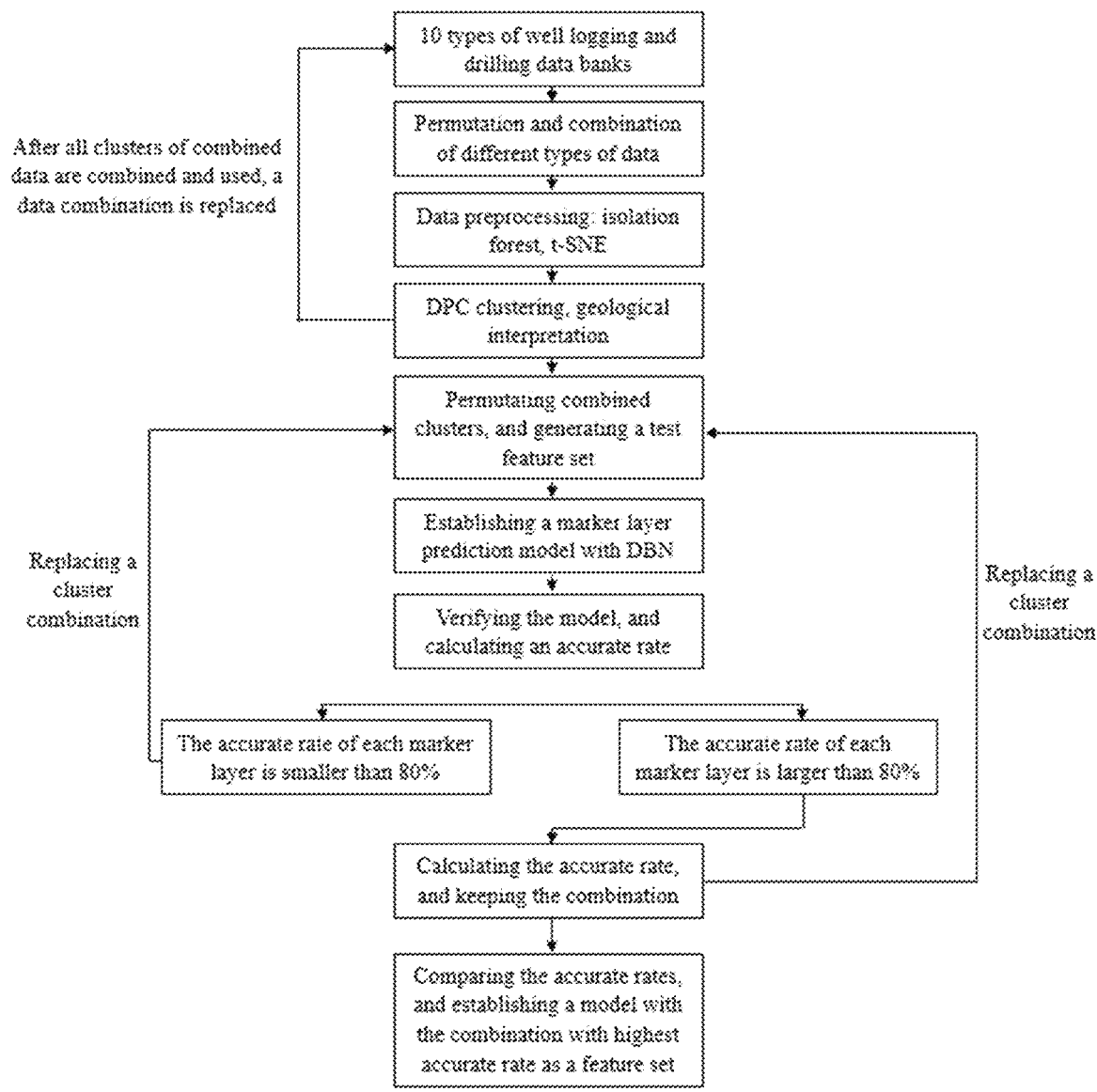
FIG. 4 is an algorithm flow chart of an intelligent real-time updating method for a stratigraphic framework with geosteering-while-drilling according to an embodiment of the present disclosure.

In this embodiment, an algorithm flow for establishing the model is shown in FIG. 4. Information of different data types in 10 types of well logging data and drilling data is permutated and combined; a certain combination is preprocessed through an isolated forest algorithm, and a t-SNE method in sequence and then is clustered through a DPC method; clusters have already been subjected to geological interpretation according to well logging with imaging-while-drilling, the clustered clusters are permutated and combined to generate a to-be-processed well logging face feature set, and then a marker layer prediction model is established through a deep belief network (DBN); and the model and cluster combinations with the accuracy rates reaching the standard are selected according to a validation set, and the accuracy rates are compared to obtain the cluster combination with highest accuracy rate. After all clusters in a certain data combination are verified, other data combinations are subjected to the above operation in sequence in turn, and the model corresponding to the data combination and the cluster combination with the highest accuracy rate is a final well logging face prediction model.

Step S300, based on the well logging data, preprocessing of eliminating abnormal values is conducted to obtain effective well logging data.

In this embodiment, in the step S300, the abnormal values are eliminated through the isolated forest algorithm, especially comprising:

Step S310, 10 kinds of well logging data and drilling data are selected, wherein the well logging data includes AC, CNL, RD, RS, COND and GR, and DEN, and the drilling data includes a drilling rate, a rotating speed, and a drilling pressure; and the well logging data or the drilling data is selected for permutation and combination to establish to-be-processed data sets.

The number of the to-be-processed data sets is:

$$C1 = C_{10}^1 + C_{10}^2 + \ldots + C_{10}^{10}$$

In this embodiment, the abnormal values are eliminated through the isolated forest algorithm. As attributes such as "acoustic logging (AC)" are not matched with the depth, some feature dimensions lack data, and a data record should be deleted. Also, some conventional well logging data is not matched with well logging with imaging-while-drilling in depth, and well logging with imaging-while-drilling is a reference standard for qualitatively judging a well logging face so that this kind of data is also deleted. In addition, unreasonable abnormal values also referred as outliers, also exist in the well logging data, which can interfere with data processing.

Step S320, a to-be-processed data combination in each to-be-processed data set is represented as $X=\{x_1, \ldots, x_i, \ldots, x_n\}$, $1 \leq i \leq n$, $\forall x_i \in X$, $x_i=(x_{i1}, \ldots, x_{i10})$, wherein $x_i$ represents data points, and $\varphi$ data points are randomly drawn from the well logging data X to constitute a subset X' to be stored in a root node.

Step S330, a dimension q is randomly selected from the well logging data, and a cut point p is randomly generated in the dimension q, wherein the cut point p satisfies $\min(x_{ij}, j=q, x_{ij} \in X') < p < \max(x_{ij}, j=q, x_{ij} \in X')$.

Step S340, hyperplanes for dividing data in the dimension q into two subspaces are generated according to the cut point p data in the dimension q is divided into hyperplanes of two subspaces according to the cut point p, and data points with values smaller than p are designated to be put into a first leaf node, and data points with values larger than or equal to p are designated to be put into a second leaf node.

Step S350, methods in steps S330-S340 recur until all leaf nodes have one data point or an isolated tree has already reached a preset height.

Step S360, the methods in the steps S320-S350 are repeated until T isolated trees are generated, wherein T isolated trees represent: the isolated trees do not have outside nodes of leaf nodes or have two leaf nodes {$T_l$, $T_r$} and one inside node test; the inside node test in the T isolated trees is composed of the dimension q and one cut point p, and points belong to $T_l$ if q<p, or otherwise belongs to $T_r$.

Step S370, the T isolated trees are an isolated tree forest; each data point $x_i$ is enabled to traverse each isolated tree and a height $h(x_i)$ of each data point $x_i$ at each isolated tree, that is, the number of the edges passed by each data point $x_i$ from the root nodes to the leaf nodes of each isolated tree is calculated, and then an average height of each data point $x_i$ in the isolated tree, the forest is calculated, and the average heights of all the data points are normalized to obtain a normalized average height $\overline{h(x_i)}$ of the data points.

Step S380, based on the normalized average height of data points $\overline{h(x_i)}$, an abnormal value score $s(x, \varphi)$ is calculated:

$$s(x, \varphi) = 2^{\frac{E(\overline{h(x_i)})}{\overline{c(\varphi)}}}$$

wherein $\overline{c(\varphi)}$ represents an average of a binary tree path length constructed by $\varphi$ data points, and E(*) represents expectation;

$$\overline{c(\varphi)} = \begin{cases} 2H(\varphi-1) - \frac{2(\varphi-1)}{\varphi}, & \varphi > 2 \\ 1, & \varphi = 2 \\ 0, & \varphi < 2 \end{cases}$$

wherein H (i) represents a harmonic number and is estimated by ln(i)+0.5772156649, 0.5772156649 is an Euler's constant;

when the abnormal value score $s(x, \varphi)$ is smaller than a preset abnormal value threshold s, a corresponding data point is eliminated to obtain effective well logging data Y={$y_1$, $y_\alpha$, ..., $y_m$}, 1≤α≤m and $y_\alpha \in$ Y, and m represents the number of the data points in the effective well logging data. In this embodiment, the abnormal value threshold preferably employs a value that the number of the reset data points after elimination is about 95% of the number of the data points before elimination.

Step S390, the methods in the steps S320-380 are repeated to select a to-be-processed data combination which is never selected for calculation of effective well logging data, and the effective well logging data with the accuracy rate reaching a first preset accuracy rate threshold and with the highest accuracy rate is selected to conduct a subsequent step, wherein the first preset accuracy rate threshold is set as 85%.

Step S400, based on the effective well logging data, non-linear dimensionality reduction is conducted to obtain dimensionality reduction well logging data.

In this embodiment, in the step S400, non-linear dimensionality reduction is conducted on the effective well logging data by using t-SNE method, specifically comprising:

Step S410, based on the effective well logging data Y={$y_1$, $y_\alpha$, ..., $y_m$}, arbitrary points $y_\alpha$ and $y_\beta$ are selected, 1≤α≤m, $y_\alpha, y_\beta \in$ Y, wherein $y_\beta$ obeys Gaussian distribution $P_\alpha$ with $y_\alpha$ as a center and $\sigma_\beta$ as a variance, $y_\alpha$ obeys Gaussian distribution $P_\beta$ with $y_\beta$ as a center and $\sigma_\alpha$ as a variance, and then the similar conditional probability $P_{\beta|\alpha}$ between $y_\alpha$ and $y_\beta$ is as follows:

$$P_{\beta|\alpha} = \frac{\exp(-\|y_\alpha - y_\beta\|^2 / 2\sigma_\alpha^2)}{\sum_{a \neq b} \exp(-\|y_\alpha - y_b\|^2 / 2\sigma_\alpha^2)}$$

wherein a user may designate perplexity Perp according to aa, the perplexity is defined as: Perp($P_\alpha$)=$2^{H(P_\alpha)}$, and H($P_\alpha$) represents Shannon information entropy of Gaussian distribution $P_\alpha$:

$$H(P_\alpha) = -\sum_\beta P_{\beta|\alpha} \log_2 p_{\beta|\alpha}$$

the joint probability $P_{\alpha\beta}$ of pairwise similarity for similar conditional probability between the data points $y_\alpha$ and $y_\beta$ in all the data points is as follows:

$$p_{\alpha\beta} = \frac{p_{\beta|\alpha} + p_{\beta|\alpha}}{2m}$$

wherein $p_{\alpha|\beta}$ represents the similar conditional probability of between $y_\beta$ and $y_\alpha$.

Step S420, it is assumed that a dimensionality reduction well logging data set Z={$z_1$, ..., $z_\alpha$, ..., $z_m$} is constructed based on the effective well logging data Y={$y_1$, ..., $y_\alpha$, ..., $y_m$}, wherein in the step S420, the effective well logging data is data in a high-dimensional space relatively to the dimensionality reduction well logging data set, the joint probability $q_{\alpha\beta}$ of corresponding simulation points $z_\alpha$ and $z_\beta$ of data points $y_\alpha$ and $y_\beta$ in the dimensionality reduction well logging data set is calculated:

$$q_{\alpha\beta} = \frac{(1 + \|z_\alpha - z_\beta\|^2)^{-1}}{\sum_{\varepsilon1 \neq \varepsilon2} (1 + \|z_{\varepsilon1} - z_{\varepsilon2}\|^2)^{-1}}$$

wherein 1≤ε1,ε2≤m, $z_{\varepsilon1}$ and $z_{\varepsilon2}$ represent two different points in the dimensionality reduction well logging data set, $z_{\varepsilon1}$, $z_{\varepsilon2} \in$ Z, and calculation of each joint probability $q_{\alpha\beta}$ traverses all two different points in the dimensionality reduction well logging data set.

Step S430, based on the joint probability $P_{\alpha\beta}$ of pairwise similarity for the similar conditional probability between the data points $y_\alpha$ and $y_\beta$ in all the data points and the joint probability $q_{\alpha\beta}$ of the corresponding simulation points $z_\alpha$ and $z_\beta$ of the data points $y_\alpha$ and $y_\beta$ in the dimensionality reduction well logging data set, the similarity C between probability distribution Q of the dimensionality reduction well logging data set and probability distribution P of the high-dimensional space of the effective well logging data is measured through KL divergence:

$$C = KL(P\|Q) = \sum_\alpha \sum_\beta p_{\alpha\beta} \log \frac{p_{\alpha\beta}}{q_{\alpha\beta}}$$

wherein the smaller the value of the similarity C is, the higher the simulation correctness of the simulation points of the dimensionality reduction well logging data set is;

the KL divergence takes a minimum value through a gradient-descent algorithm:

$$\frac{\delta C}{\delta z_\alpha} = 4 \sum_\beta (p_{\alpha\beta} - q_{\alpha\beta})(z_\alpha - z_\beta)(1 + \|z_\alpha - z_\beta\|^2)^{-1}$$

a dimensionality reduction well logging data set $Z=\{z_1, \ldots, z_\alpha, \ldots, z_m\}$ is obtained;

previous two dimensions in the dimensionality reduction well logging data set are kept, and the rest dimensions are deleted to obtain dimensionality reduction well logging data $\hat{Z}=\{\hat{z}_1, \ldots, \hat{z}_\alpha, \ldots, \hat{z}_m\}$. The dimensionality reduction well logging data sets in the previous two dimensions are selected, that is, the dimensionality reduction well logging data set in two dimensions that can interpret the most content are selected, for visual cross plot processing. Therefore, data features of man-machine interaction are extracted; the recognition precision is improved; the complexity of the data is weakened, and real-time recognition of the model is ensured.

Figure 5:
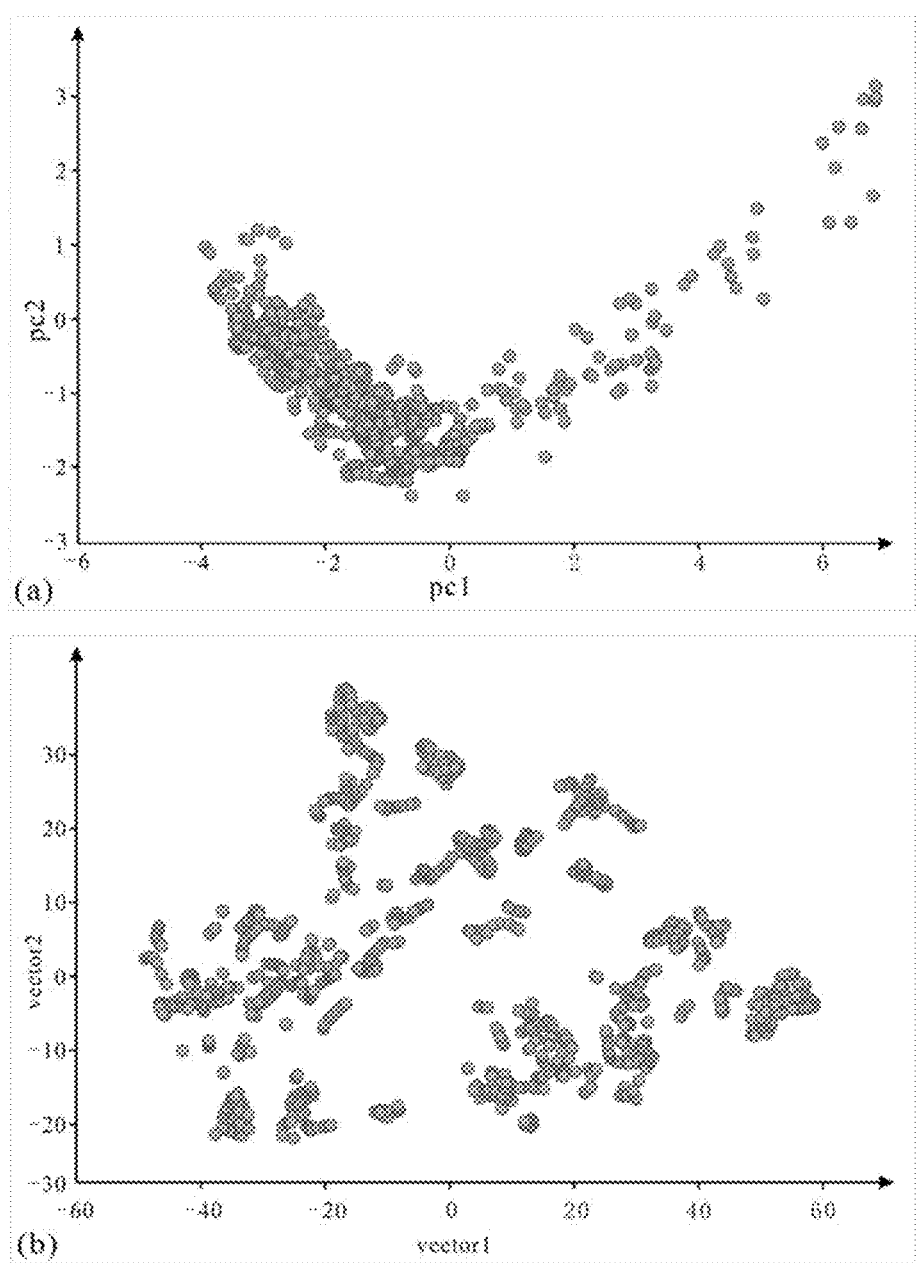
FIG. 5 is a schematic diagram showing the effect of comparison through two dimensionality reduction methods according to an embodiment of the present disclosure.

The non-linear dimensionality reduction and the effect of using the non-linear dimensionality reduction to process the data of the present disclosure are shown in FIG. 5. An objective of dimensionality reduction is to simplify the data structure, to facilitate ordered visual processing. Due to changes in lithology of sediments and easily generated diagenesis and random fractures, the reservoir has very strong heterogeneity, which also results in a non-linear mapping relationship between the geophysical data and markers. If a conventional linear dimensionality reduction operation is employed, a principal component analysis (PCA) method which is shown as (a) in FIG. 5, data points after dimensionality reduction shows a shape of "√", and an aliasing phenomenon of a great number of data points still occurs. Therefore, at this time, t-SNE non-linear dimensionality reduction, as shown as (b) in FIG. 5, is employed. After dimensionality reduction, the data points are obviously distinguished, and the data points at different positions represent different geological meanings; therefore, the data structure is simplified, and non-linear mapping features between the data and the geological meanings may be effectively extracted.

Step S500, based on the dimensionality reduction well logging data, non-linear clustering is conducted through a density peak clustering method, and interactive quantitative evaluation is conducted in combination with cores and well logging with imaging-while-drilling to obtain a labeled well logging data cluster.

The step S500 specifically comprises:

Step S510, Euclidean distances $d_{\alpha\beta}$ between all data points in the dimensionality reduction well logging data is calculated:

$$d_{\alpha\beta} = d[(\hat{z}_{\alpha 1}, \hat{z}_{\alpha 2}), (\hat{z}_{\beta 1}, \hat{z}_{\beta 2})] = \left(\sum_{e=1}^{2} |\hat{z}_{\alpha e} - \hat{z}_{\beta e}|^2\right)^{1/2}$$

Step S520, according to the demand on the clustering number, a cutoff distance dc is set, wherein e represents a dimension of the dimensionality reduction well logging data set.

In the case of considering the recognition efficiency and precision, the larger the number of the clusters is better; so that strata information reflected between clusters may be distinguished as much as possible, and the phenomenon that one cluster reflects the strata information at a plurality of horizons is avoided to the maximum. The smaller the cutoff distance dc is set, the more the categories are generated, and the more detailed the stratum features corresponding to the categories are. However, too many categories can result in low operational efficiency. Thus, after comprehensive analysis, a set value of dc is determined, so that the number of clustered categories is about 30.

Step S530, a density $\rho_\alpha$ of each node is calculated based on the cutoff distance:

$$\rho_\alpha = \sum_{\beta \neq \alpha} e^{-\left(\frac{d_{\alpha\beta}}{dc}\right)^2}$$

Step S540, a relative distance $\delta_\alpha$ between the nodes is calculated:

$$\delta_\alpha = \begin{cases} \max(d_{\alpha\beta}), & \rho_\alpha > \rho_\beta \\ \min(d_{\alpha\beta}), & \rho_\alpha \leq \rho_\beta \end{cases}$$

Step S550, with the density $\rho_\alpha$ as an abscissa and the relative distance $\delta_\alpha$ as an ordinate, a two-dimensional diagram is drawn, a point in the clustering center is determined, and all the data points are grouped into the closest data points with a density larger than those of the above data points to obtain a well logging data cluster.

Figure 6:
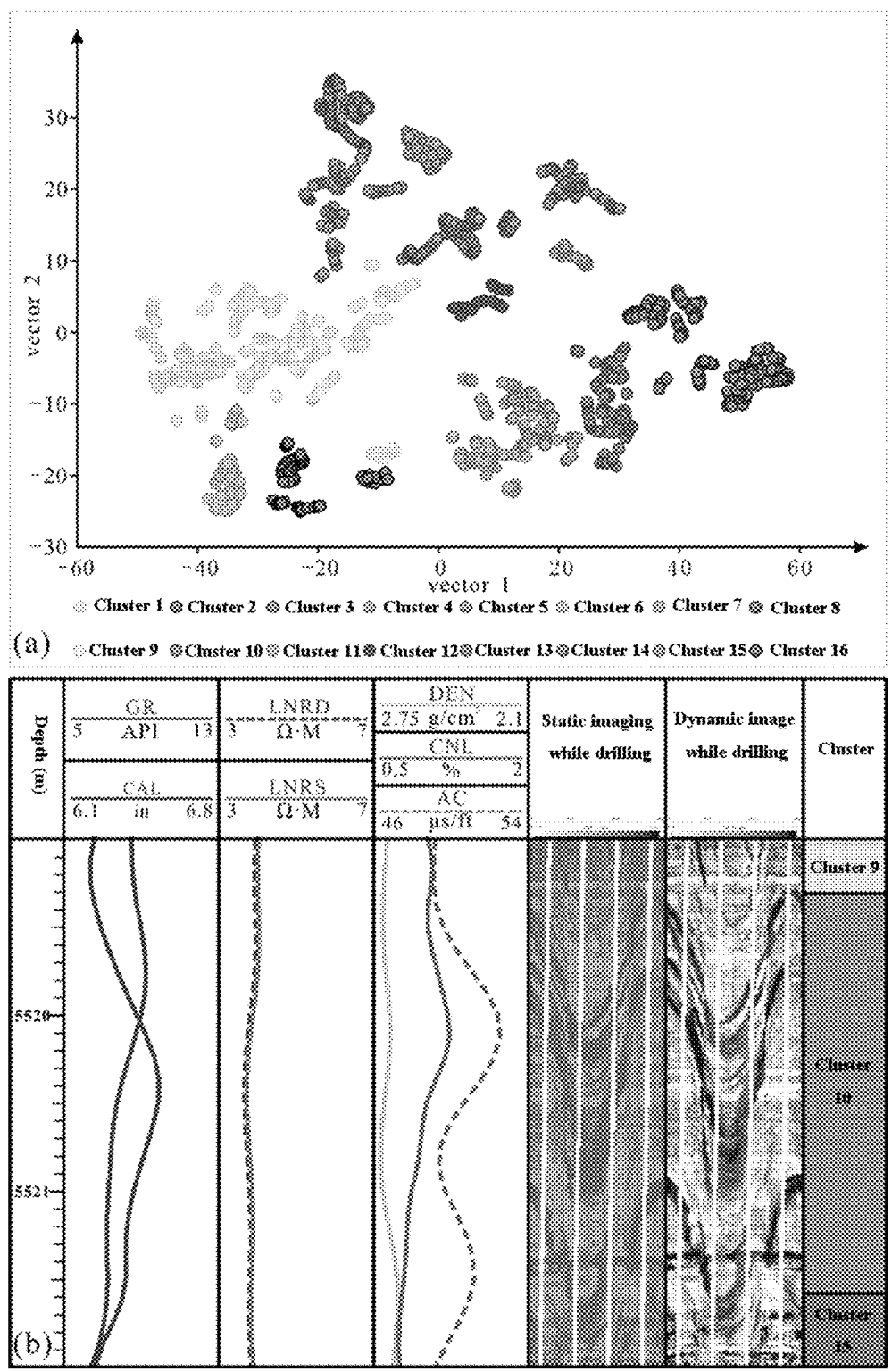
FIG. 6 is a schematic diagram showing geological interpreting results through a marker layer 1 based on density peak clustering (DPC) according to an embodiment of the present disclosure.

Step S560, based on the well logging data cluster, through a feature chart based on marker layers, interactive quantitative evaluation is conducted on the well logging data cluster by applying a core and well logging with imaging-while-drilling at a corresponding depth, and a labeled well logging data cluster is obtained. The effect through DPC clustering is shown in FIG. 6. In this embodiment, parameters are set to enable the data to be clustered into 30 categories. Therefore, results of a plurality of categories may be ensured to correspond to one marker layer, which provides a basis for further optimizing the feature set subsequently and improves the acquisition ability of non-linear mapping features of the marker layers; and the effect of DPC clustering is superior to conventional linear clustering. If the conventional linear clustering method, such as K-means, is employed, only spherical clusters can be obtained, which can result in data aliasing between the marker layers after being interpreted; thus the feature set cannot be accurately established. However, in this embodiment, the non-linear clustering method (i.e. density peak clustering (DPC)) with better effect is employed, the spherical clusters may be clustered, and linear strip feature clusters, annular feature clusters, or irregular feature clusters may also be clustered. By conducting interactive geological interpretation through well logging with imaging-while-drilling and the cores, the obtained marker layers do not have the data aliasing phenomenon, and the situation of geologic marker layers can be more clearly reflected.

Step S600, based on the well logging data cluster, a marker layer primary prediction result is obtained through a marker layer prediction model based on a deep belief network.

The marker layer prediction model based on the deep belief network is used for establishing a mapping relationship between the feature set and the corresponding geological phenomenon by iteratively adjusting interlayer parameters and then establishing a discrimination model of the corresponding geological phenomenon. Due to the complex structure and strong heterogeneity of the stratum, the geophysical data is also complex. Meanwhile, as geophysics has a multiplicity of solutions in nature, the mapping relationship between the geological phenomenon and the geophysical data is always non-linear; whereas the deep belief network can accurately establish such a complex non-linear mapping relationship and is an effective tool for creating a stratum recognition model decider.

In this embodiment, before obtaining the marker layer primary prediction result through the marker layer prediction model based on the deep belief network, step S600 further comprises the step of selecting feature combination, especially comprising:

Step A100, well logging data is processed and verified through the method as in the steps S100-S500 to obtain well logging data clusters.

The data set comprises data corresponding to the marker layers and further comprises data corresponding to non-marker layers. A great quantity of clusters clustered by t-SNE is subjected to interactive qualitative labeling through lithology and imaging logging, and the feature set is established. "Clusters" with labels in the feature set are further subdivisions for the stratum features. For example, a second cluster represents a horizon with thin grits in a marker layer 3; whereas a nineteenth cluster represents a horizon with thick grits in a marker layer 3. However, different thin layers in some strata are extremely similar, so one cluster represents data reflected by the thin layers in different strata. For example, a seventh cluster represents an argillaceous layer in marker layer 2 and an argillaceous layer in the non-marker layer. If in model training of the feature set, such clusters representing a plurality of stratum features are kept, chaotic recognition can be caused, and the recognition precision cannot be ensured. After this category of clusters is removed, although the features of a certain thin layer in a certain marker layer are lost, the whole data features of the marker layer are kept, and the kept data has a greater probability to belong to the marker layer. Thus, the recognition precision of the marker layer is greatly improved. As the labels of the clusters are qualitatively discriminated through the lithology and imaging logging, interference caused by human factors can often exist, so that the category of the clusters is not entirely correct; and wrong cluster labels may further cause weakening in recognition precision, so that the cluster combinations require to be further screened.

Step A200, clusters belonging to a marker layer 1 are numbered, and various clusters in the well logging data cluster are arbitrarily combined, wherein a combination number of the clusters belonging to the marker layer 1 is:

$$C1 = C_g^1 + C_g^2 + \ldots + C_g^g$$

combinations of clusters belonging to a marker layer 2 and a marker layer 3 are C2 and C3.

Step A300, all cluster combinations are input into the deep belief network as monitoring data, and the accuracy rate A and the accuracy rate P of recognition of the marker layers of the well logging data are calculated and verified:

$$A = \frac{TP + TN}{TN + FN + TP + FP}$$

$$P = \frac{TP}{TP + FP}$$

wherein TP represents that for a sample, the true category is positive, and the prediction category is also positive; FN represents that for the sample, the true category is positive, and the prediction category is negative; FP represents that for the sample, the true category is negative, and the prediction category is positive; and TN represents that for the sample, the true category is negative, and the prediction category is also negative.

Step A400, judging whether the accuracy rates of three marker layers in the marker layer primary prediction result are all larger than a preset second accuracy rate threshold or not; if the accuracy rates are not larger than the preset second accuracy rate threshold, selecting another group of cluster combination which is never selected; and if the accuracy rates are larger than the preset second accuracy rate threshold, calculating the group of cluster combination and the accuracy rate.

Figure 7:
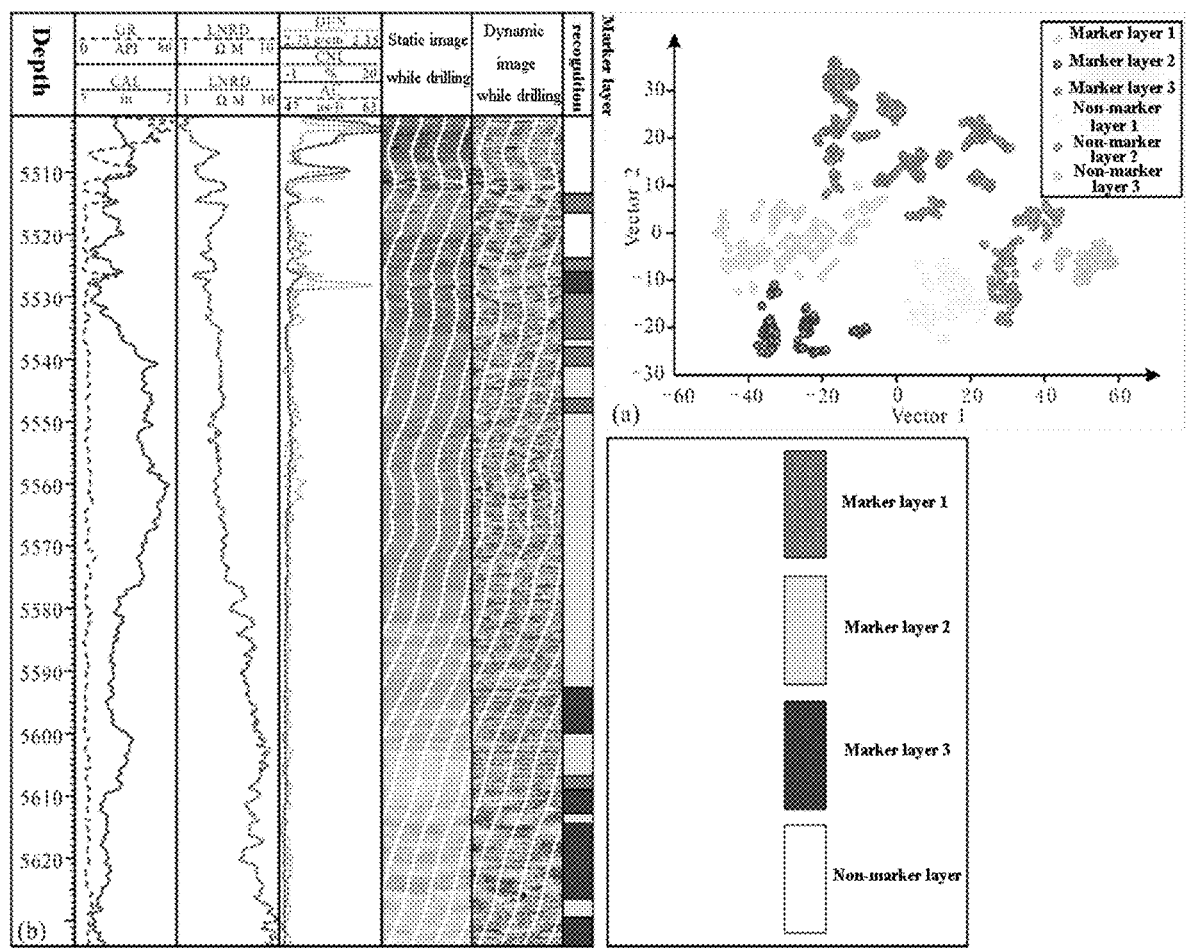
FIG. 7 is a schematic diagram showing the effect of using all clusters for geological analysis according to an embodiment of the present disclosure.
Figure 8:
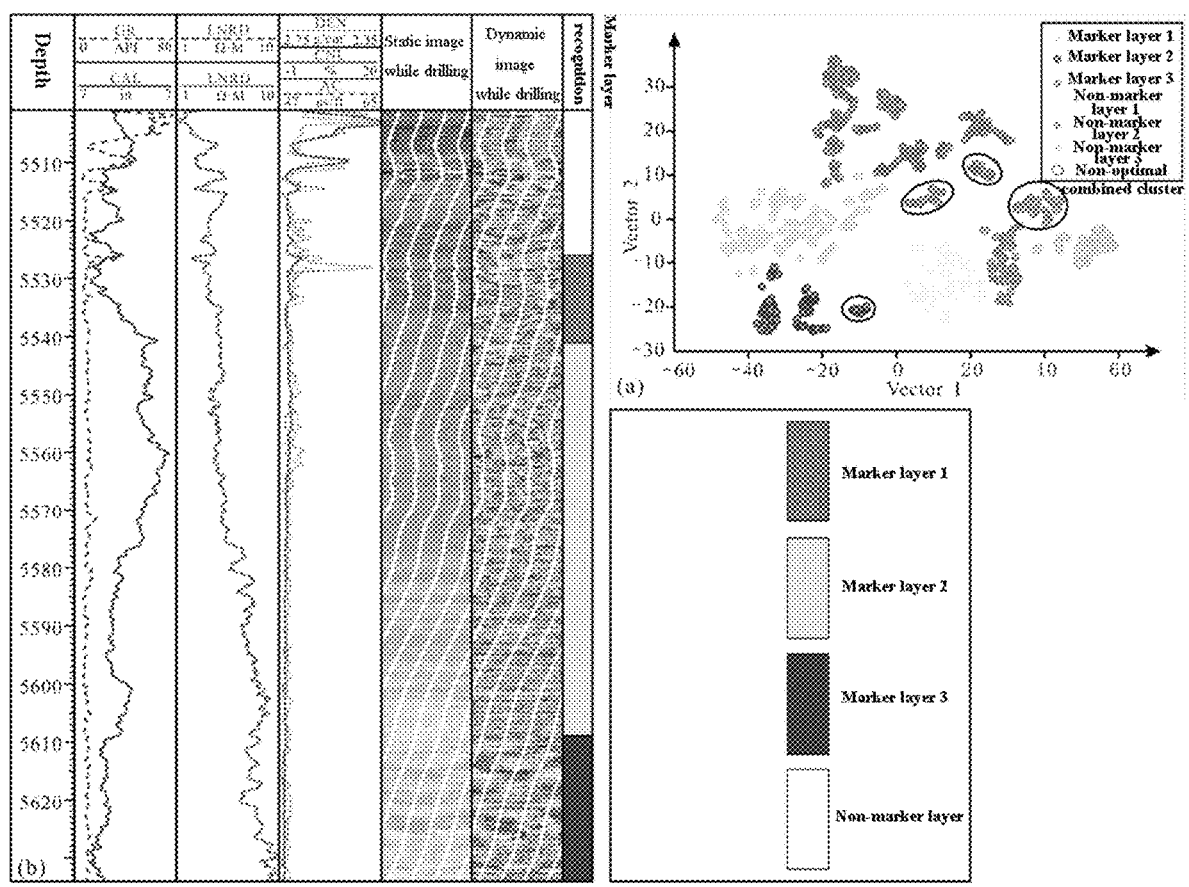
FIG. 8 is a schematic diagram showing a geological analysis effect of selecting an optimal cluster combination for analysis.

Step A500, the methods in the steps A300-A400 are repeated to calculate all primary prediction results that the accuracy rates are larger than the preset second accuracy rate threshold, the primary prediction result with the highest accuracy rate is selected, and a corresponding cluster combination is taken as a selected well logging data cluster, and a deep belief network structure is taken as the marker layer prediction model based on the deep belief network. The comparison of prediction results for whether the cluster combinations are selected or not is shown in FIG. 7 and FIG. 8. FIG. 7 shows that all the clusters are used for prediction in the marker layer. By selecting the cluster combinations for prediction, as shown in FIG. 8, both the accuracy rate and the correct rate are better than those obtained by inputting all the clusters into the model, and recognized strata are prevented from being chaotic. The key to creating a complex non-linear mapping relationship model is to find the feature set which can accurately reflect the horizon of the marker layer, and a certain cluster in the feature set is ensured to be in one-to-one correspondence to a certain thin layer in the marker layer as much as possible. The clusters are combined to serve as a validation feature set and are substituted into a deep belief model for training, and then the correct rate of the model is checked. The higher the correct rate is, shows that the possibility that a certain cluster in the combination has mapping relationships with a plurality of strata is lower, and also shows that the ability of the combination of extracting the features of the strata is stronger, and the recognition effect is also better. If the cluster combining mode is not employed, a recognition model is established by directly training the clusters marked by the lithology and imaging logging through the deep belief network, which can result in a chaotic recognition result of the marker layers. For example, in the chaotic recognition result, horizons, at which other non-marker layers are located, exist, or recognitions in markers 1, 2, and 3 are interspersed with each other; therefore, the position, at which a certain marker layer is located, cannot be accurately positioned.

In this embodiment, the marker layer prediction model based on the deep belief network is as follows:

the deep belief network is defined to comprise two layers of restricted Boltzmann machines (RBM) and a layer of BP multi-layer feedforward neural network; the two layers of RBMs are both fully connected, and the BP network is in unilateral connection; and the number of visible units and the number of hidden units in the RBM are $\gamma$ and $\chi$ respectively, the hidden layer of the previous RBM is the visible layer of the next RBM, and the energy function of the RBM is represented as:

$$E(p, q; \theta) = -\sum_{u=1}^{\gamma} r_u p_u - \sum_{v=1}^{\chi} s_v p_v - \sum_{u=1}^{\gamma}\sum_{v=1}^{\chi} p_u \omega_{uv} q_v$$

wherein $p_u$ represents a state vector of a visible layer; $q_v$ represents a state vector of a hidden layer; $r_u$ represents a bias of the visible layer; $s_v$ represents a bias of the hidden layer; and $\omega_{uv}$ represents a link weight between the visible layer and the hidden layer;

wherein the possibility that neurons $q_v$ in the hidden layer are activated is:

$$P(q_v|p; \theta) = \frac{1}{1 + e^{-r_v} - \sum_u p_u \omega_{uv}}$$

As the hidden layer is fully connected with the visible layer, the visible layer may be activated by the hidden layer similarly; and the possibility that the visible layer is activated is:

$$P(p_u|q; \theta) = \frac{1}{1 + e^{-s_u} - \sum_u q_v \omega_{uv}}$$

At this time, a function domain is [0,1] and is used for describing the possibility that the neurons are activated; and the neurons at the same layer are not connected, thereby meeting the probability of surface density independence.

$$P(q|p; \theta) = \prod_{v=1}^{\chi} P(q_v|p; \theta)$$

$$P(p|q; \theta) = \prod_{u=1}^{\gamma} P(p_u|q; \theta)$$

After well logging data clusters with labels are endowed with the visible layers, the possibility $P(p_u|q;\theta)$ that the neurons in each hidden layer are activated is calculated, and [0,1] is taken as a threshold; when $P(p_u|q;\theta) \ge [0,1]$, $p_u=1$; and when $P(p_u|q;\theta) < [0,1]$, $p_u=0$. Thus, whether the neurons in each hidden layer are activated or not may be obtained; and one RBM model is determined according to parameters $r_u$, $s_v$ and $\omega_{uv}$.

The possibility that a $\xi_{th}$ sample belongs to the category $\lambda_\zeta$ is:

$$p(\lambda_\zeta = \kappa \mid f^\eta(\varepsilon_\xi), V^\eta, C^\eta) = \frac{\exp(V_\kappa^\eta f^\eta(\varepsilon_\xi) + C^\eta)}{\sum_{\kappa=1}^C \exp(V_\kappa^\eta f^\eta(\varepsilon_\xi) + C^\eta)}$$

In the formula, V represents the parameter coefficient, C is the number of fault categories, $\kappa$ is the category; and $r_u$, $s_v$ and $\omega_{uv}$ are adjusted through the stochastic gradient method and are repeatedly iterated to a preset iterative time, and the trained marker layer prediction model based on the deep belief network is obtained.

Step S700, depth correction and dipping angle and dipping direction correction are conducted on the stratigraphic framework model through the marker layer primary prediction result to obtain a corrected stratigraphic framework model, and a drilling trajectory is adjusted according to the corrected stratigraphic framework model.

In this embodiment, depth correction specifically comprises:

according to the marker layer primary prediction result, primary prediction positions of boundaries of the marker layers are determined, and images with imaging-while-drilling containing the upper boundaries and the lower boundaries of the marker layers are obtained.

Boundaries of the strata are target information in the images, and the lithology and the physical properties above and below the boundaries have differences. However, the boundaries are similar to faults, fractures, and the like in image features and are interfered by the geological phenomena of holes, caves, and the like. Therefore, an image at a lower layer requires to be segmented for recognition. A full convolutional neural network (FCN) may effectively segment the images and originally has three network structure models FCN-32s, FCN-16s and FCN-8s. On this basis, a network structure model FCN-2s which can extract features from a shallower layer is added, the improved FCN is obtained, and extraction of the boundaries of the strata is more facilitated. An image set is substituted into the improved FCN to obtain 4 image segmenting results. The 4 image segmenting results are compared and analyzed, what may be the boundaries of the strata are determined from the images obtained by FCN-2s; interference from the strata and the fractures are excluded from the images obtained by FCN-32s, FCN-16s, and FCN-8s; in combination with well data in an existing well, the geological features of the lithology, the physical properties and the like above and below the boundaries of the strata are determined; and in combination with the established feature chart of the reservoir and the marker layers, recognition of the upper and lower boundaries of the marker layers are completed.

Figure 9:
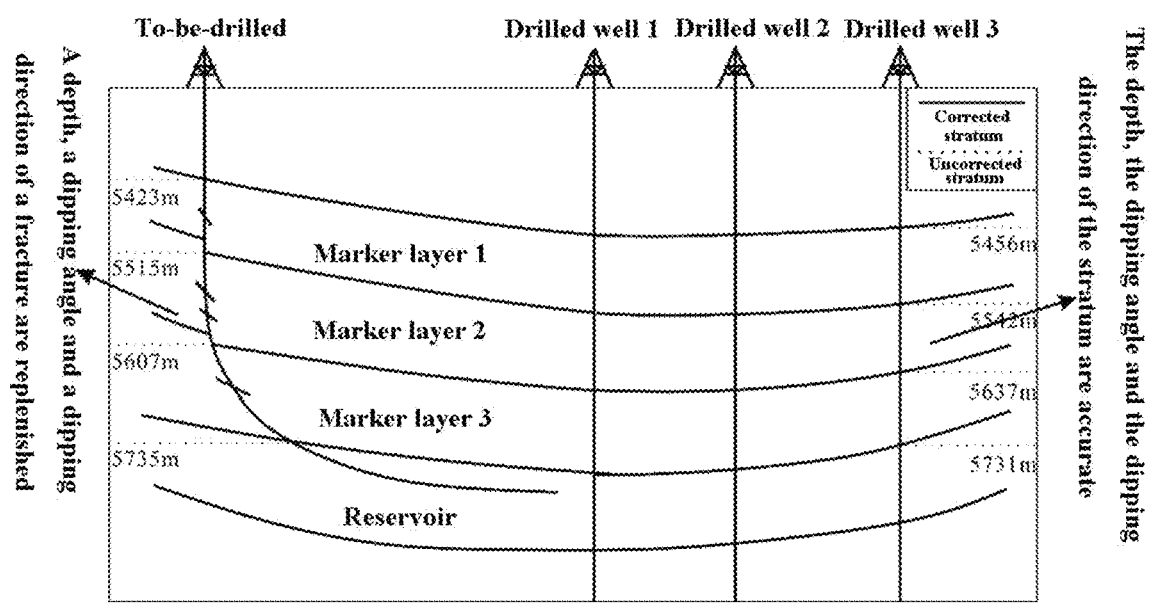
FIG. 9 is a principle schematic diagram of depth correction according to an embodiment of the present disclosure.

Accurate depths of the upper boundaries and the lower boundaries of the marker layers are acquired from the images with imaging-while-drilling containing the upper boundaries and the lower boundaries of the marker layers through the full convolutional neural network, and then depth correction is conducted on the stratigraphic framework model. The principle of depth correction is shown in FIG. 9.

Figure 10:
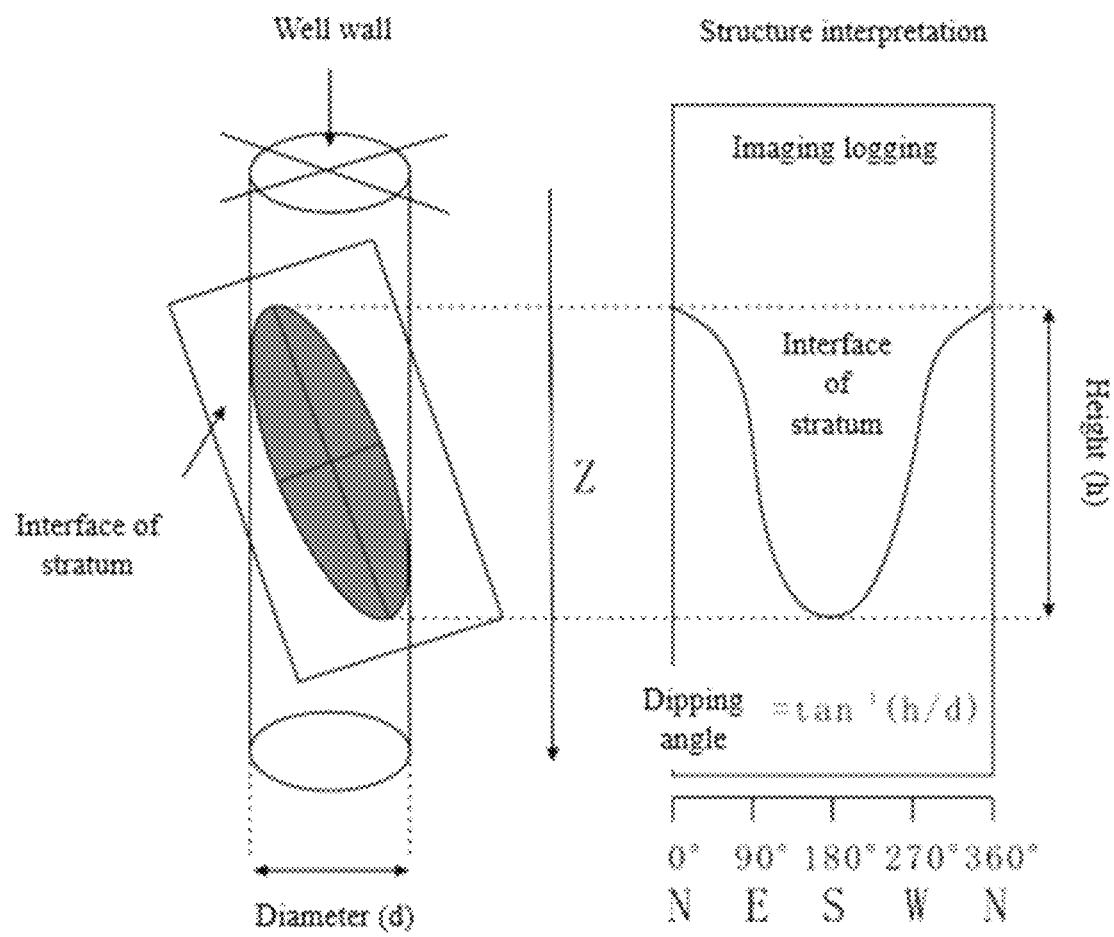
FIG. 10 is a principle schematic diagram of dipping angle correction according to an embodiment of the present disclosure.

In this embodiment, dipping angle and dipping direction correction specifically comprise:
based on a mapping relationship between the images with imaging-while-drilling and a dipping angle and a dipping direction of a stratum, the dipping angle and the dipping direction of the stratum are calculated according to curvature and a peak value of an interface between marker layers, wherein a dipping angle α of the stratum relative to a drilled well is equal to $\text{Tan}^{-1}$ (lower peak depth-upper peak depth)/well diameter, and a dipping direction of the stratum relative to the drilled well is an orientation corresponding to a lower peak; and in combination with real-time dipping angle and dipping direction of drilling equipment, the dipping angle and the dipping direction of the stratigraphic framework model are correct. The principle of dipping angle correction is shown in FIG. 10.

In this embodiment, the method further comprises:
Step S800, based on the images with imaging-while-drilling, a fracture image is extracted through a fracture image extraction model based on the optimized convolutional neural network, the dipping angle and the dipping direction from the fracture image are calculated according to the curvature, and the peak value of the interface between the marker layers, and the dipping angle and the dipping direction are added in the corrected stratigraphic framework model to obtain a perfect stratigraphic framework model.

Figure 11:
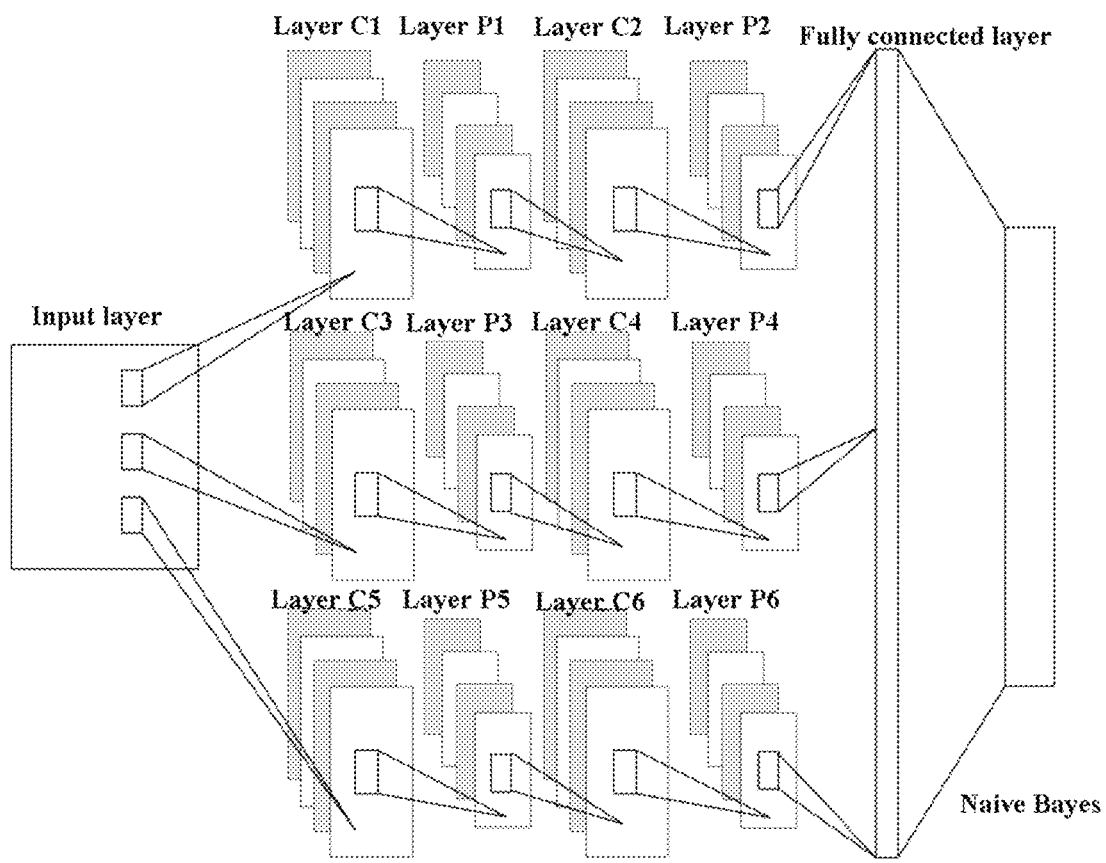
FIG. 11 is a structural schematic diagram of a fracture image extraction model based on an optimized convolutional neural network according to an embodiment of the present disclosure.

Due to complex and diversified fractures, for example, large fractures, tiny fractures, high-angle fractures, low-angle fractures, and the like, an original convolutional neural network has one channel, is difficult to extract complex fracture information at different levels, and can be affected by dissolution pores and pseudo-fractures at the same time. The present disclosure designs a convolutional neural network with n channels of different structures to recognize the fractures of the strata. Multi-dimension features of different types of fractures are extracted through n channels on different scales. Meanwhile, due to realtime of while drilling, fractures require to be rapidly recognized; therefore, the decider of the convolutional neural network is changed by Naive Bayes from Softmax, and the prediction efficiency is improved,
wherein the fracture image extraction model based on the optimized convolutional neural network is an n-channel image recognition network, comprising 2n convolutional layers and 2n average pooling layers; various channels are a first convolutional layer, a first average pooling layer, a second convolutional layer and a second average pooling layer which are connected in sequence; scales of various convolutional layers are different; in the $f^{th}$ channel, the first convolutional layer is $(4*f-1)*(4*f-1)$, and the second convolutional layer is $(4*f+4)*(4*f+4)$; and the sizes of various pooling layers are the same, being 2*2. One fully connected layer and one Naive Bayes decider are collectively connected after all the channels. Model results are shown in FIG. 11.

In this embodiment, the step S800 specifically comprises:
Step S810, based on the images with imaging-while-drilling, different scales of fracture features are extracted through the first convolutional layers, the first average pooling layers, the second convolutional layers, and the second average pooling layers of different channels of the fracture image extraction model based on the optimized convolutional neural network.

Step S820, different scales of fracture features are combined into a comprehensive fracture feature through the fully connected layer.

In this embodiment, the preferred fracture image extraction model is specified as follows: a layer C1 is obtained by convolving 8 3*3 convolution kernels with input images to obtain 8 feature diagrams with the size of 190*190, and then a pooling layer P1 conducts a pooling operation on the convolutional layer C1 in a unit of 2*2, and the layer P1 is composed of 8 95*95 feature diagrams. Then, 16 8*8 convolution kernels convolve with the P1 to obtain a convolutional layer C2 which is composed of 16 88*88 feature diagrams; and then the pooling operation is conducted on the C2 in a unit of 2*2 to obtain a pooling layer P2 which is composed of 16 44*44 feature diagrams.

A layer C3 is obtained by convolving 8 7*7 convolution kernels with input images to obtain 8 feature diagrams with the size of 186*186, and then a pooling layer P3 conducts the pooling operation on the convolutional layer C3 in a unit of 2*2, and the layer P3 is composed of 8 93*93 feature diagrams. Then, 16 12*12 convolution kernels convolve with the P3 to obtain a convolutional layer C4 which is composed of 16 82*82 feature diagrams; and then the pooling operation is conducted on the C4 in a unit of 2*2 to obtain a pooling layer P4 which is composed of 16 41*41 feature diagrams.

A layer C5 is obtained by convolving 8 11*11 convolution kernels with input images to obtain 8 feature diagrams with the size of 182*182, and then a pooling layer P5 conducts the pooling operation on the convolutional layer C5 in a unit of 2*2, and the layer P5 is composed of 8 91*91 feature diagrams. Then, 16 16*16 convolution kernels convolve with the P5 to obtain a convolutional layer C5 which is composed of 16 76*76 feature diagrams; and then the pooling operation is conducted on the C6 in a unit of 2*2 to obtain a pooling layer P6 which is composed of 16 38*38 feature diagrams.

Step S830, a fracture image is rapidly extracted from the comprehensive fracture feature through the Naive Bayes decider; and the Softmax is replaced by the Naive Bayes decider as the decider. A Softmax classifier is a main classifier for the convolutional neural network, whereas it is correct only when the probability of the Soft classifier classifying checked objectives is larger than 90%; the operation time is long as the calculation can be continuously conducted with a loss function, whereas attributes are independent of each other in condition when Naive Bayes gives a target value so that calculating parameters are reduced, and internal consumption and the time are saved; the algorithm is simple and rapid and more facilitates real-time fracture recognition while drilling.

Figure 12:
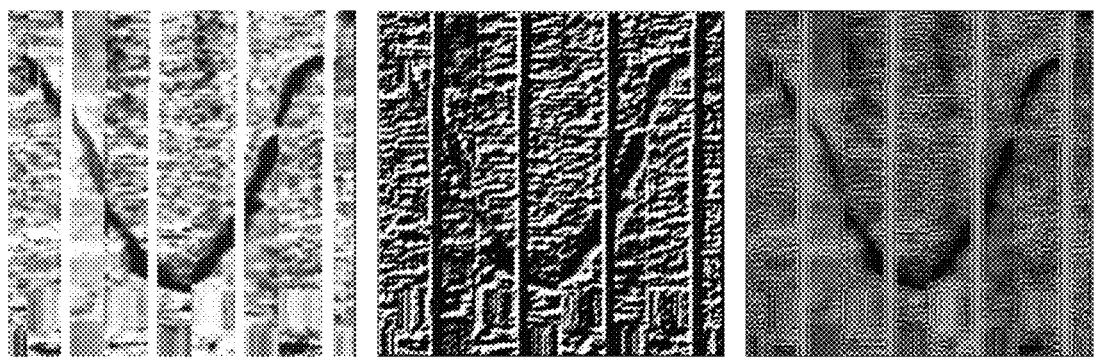
FIG. 12 diagrams showing structural schematic diagrams of fracture images extracted from different scales of convolution kernels according to an embodiment of the present disclosure.

The fracture feature images extracted through convolution kernels in different scales are shown in FIG. 12; the left diagram shows dynamic well logging with imaging-while-drilling; and the middle diagram and the right diagram show fracture feature images generated by convolution of different convolution kernels. When complex fractures are encountered while drilling, the sizes of the convolution kernels are different, and the extracted features reflect features, at different levels, of the fractures, so that the recognition precision of the fractures is effectively improved. For example, small sizes of the convolution kernels reflect features at shallow layers; and large sizes reflect features at deep layers.

Step S840, the dipping angle and the dipping direction of the stratum are calculated according to curvature and a peak value of a fracture, wherein a dipping angle β of the fracture relative to the drilled well is equal to $\text{Tan}^{-1}$ (lower peak depth-upper peak depth)/well diameter, and a dipping direction of the fracture relative to the drilled well is an orientation corresponding to a lower peak; and in combination with real-time dipping angle and dipping direction of drilling equipment, the dipping angle and the dipping direction of the fracture are corrected to obtain a corrected fracture image.

Figure 13:
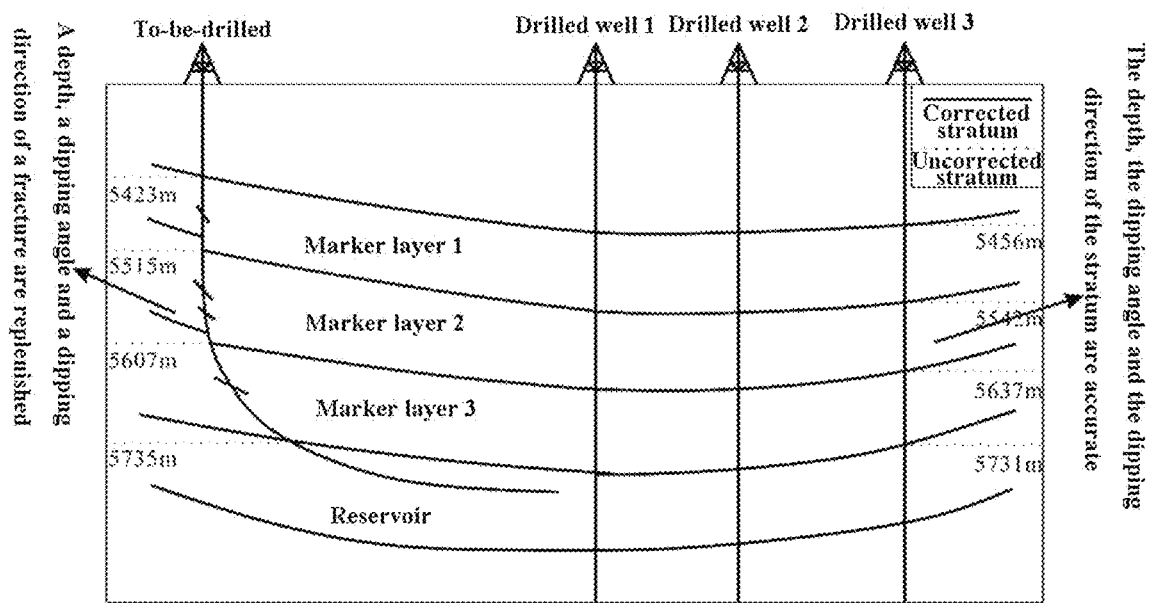
FIG. 13 is a schematic diagram of a perfect stratigraphic framework model according to an embodiment of the present disclosure.
Figure 14:
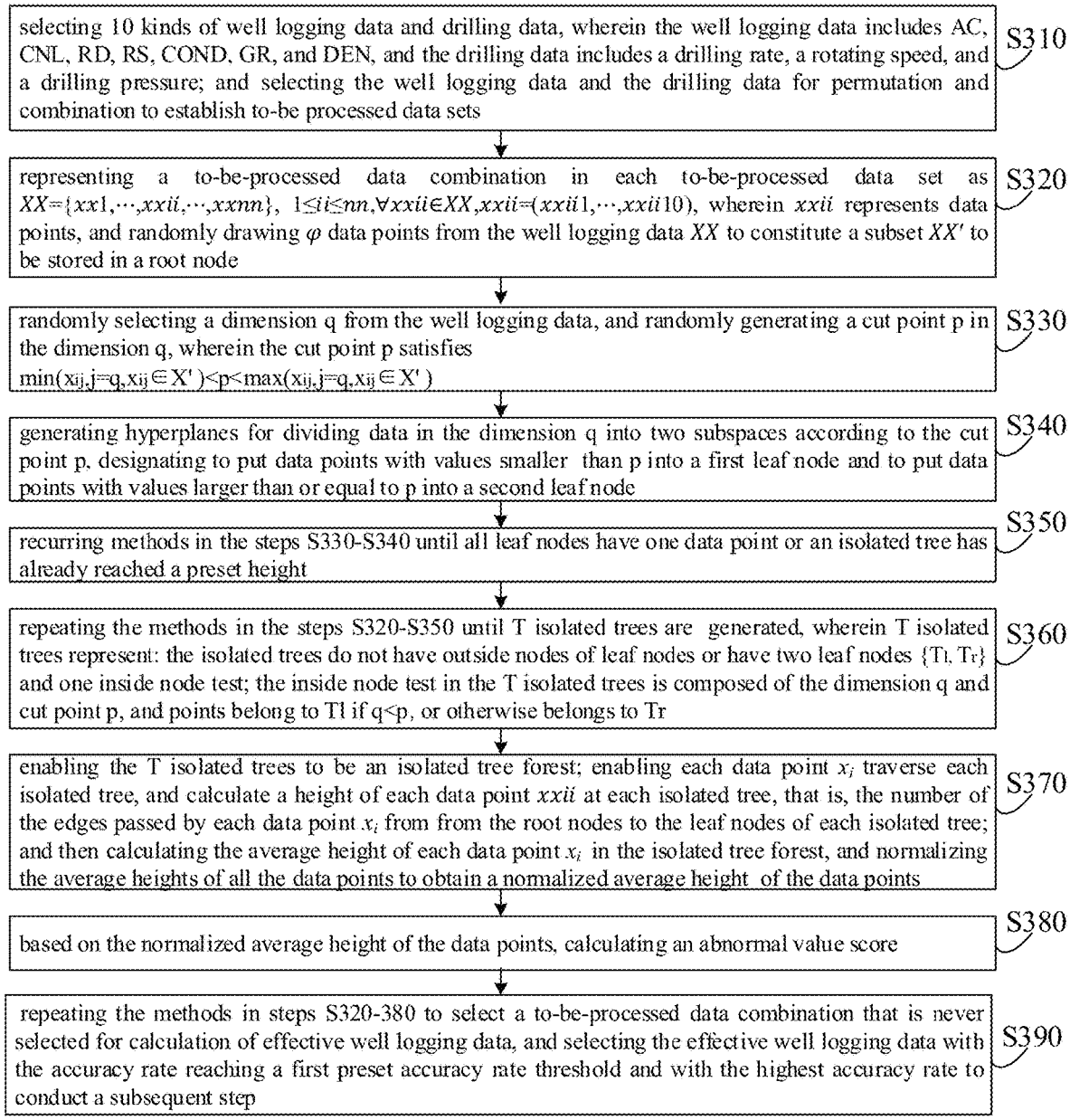
FIG. 14 is a flow chart of a method for eliminating the abnormal values through the isolated forest algorithm according to an embodiment of the present disclosure.
Figure 15:
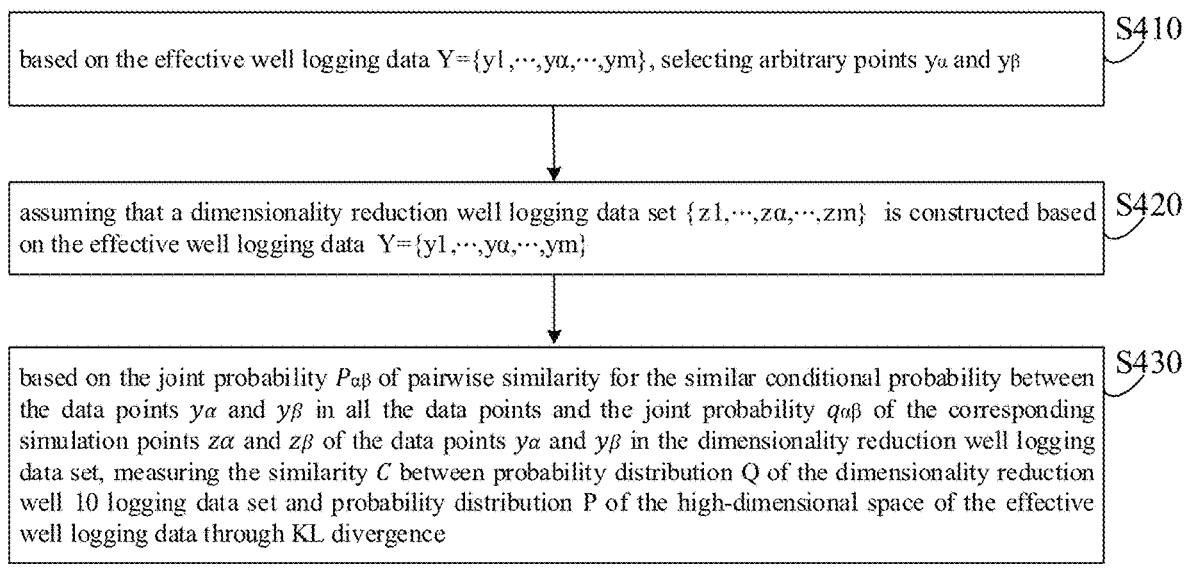
FIG. 15 is a flow chart of a t-SNE method according to an embodiment of the present disclosure.
Figure 16:
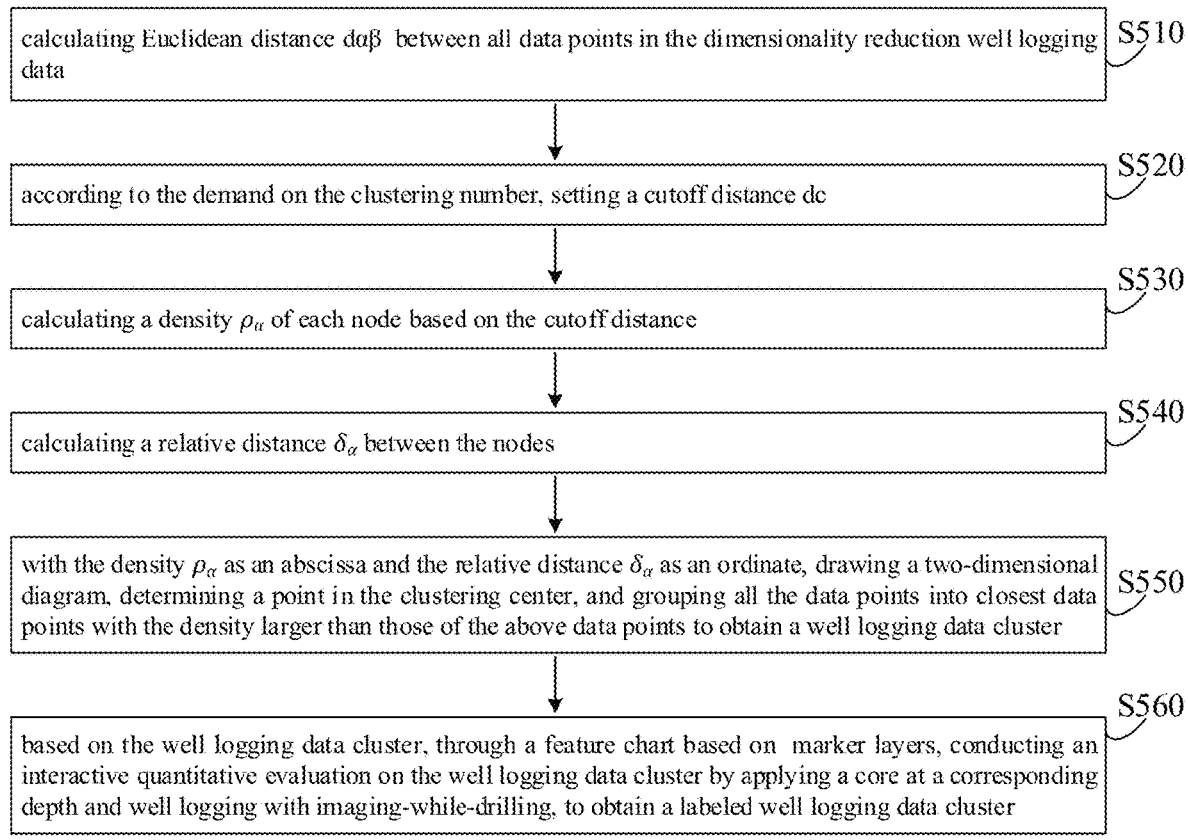
FIG. 16 is a flow chart of the step S500 according to an embodiment of the present disclosure.
Figure 17:
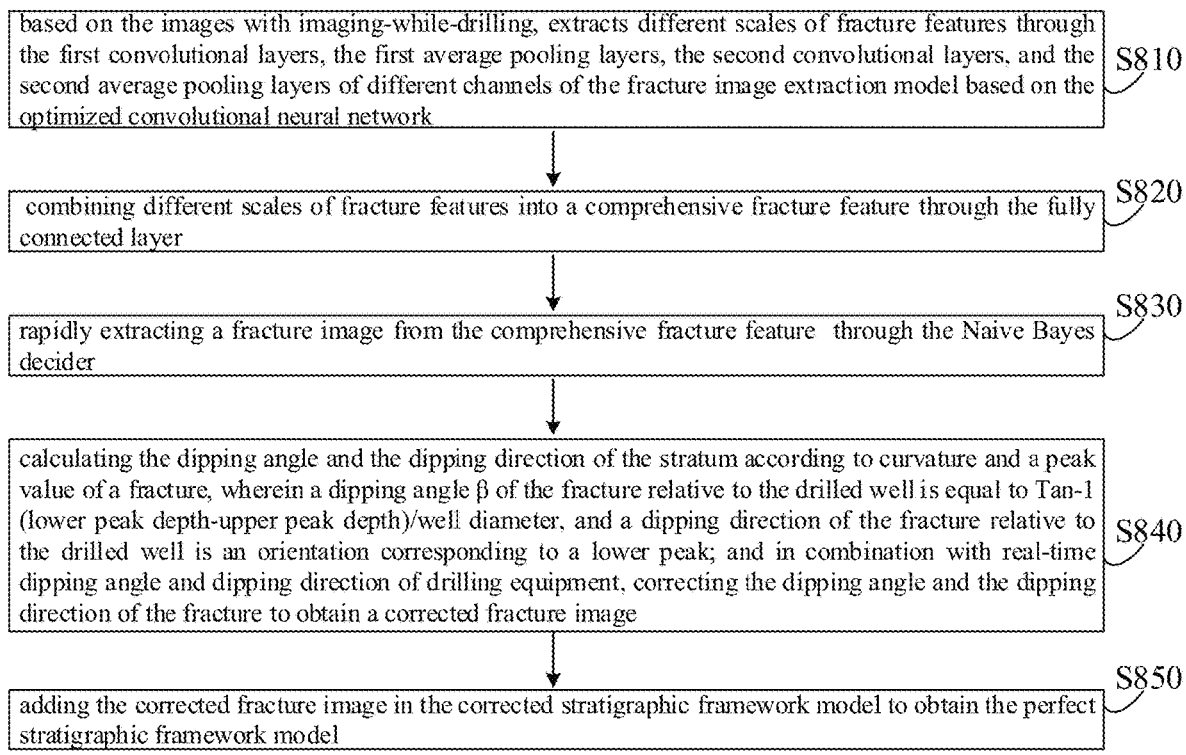
FIG. 17 is a flow chart of the step S800 according to an embodiment of the present disclosure.

Step S850, the corrected fracture image is added to the corrected stratigraphic framework model to obtain the perfect stratigraphic framework model. The perfect stratigraphic framework model is shown in FIG. 13. Through correction of the depths, the dipping angles, and the dipping directions of the marker layers, the present disclosure can determine the position and geological information of the drill bit in the process while drilling and then predicts the position of the reservoir for providing a basis for a design on a well trajectory. The stratum at a fracture is unstable, which may result in a collapse of the well wall in the subsequent drilling process, so that effective recognition of the fracture may avoid similar situations by taking measures as soon as possible; in addition, a large fracture may have a link with oil-gas migration, and a fault may further result in non-correspondence between a stratum and a next stratum. Correction on these depths, dipping angles, and dipping directions of the marker layers and replenishment for the fractures provides a basis for a further design on the well trajectory.

Another aspect of the present disclosure, provided is an intelligent real-time updating system for a stratigraphic framework with geosteering-while-drilling, comprising while-drilling information acquiring module, a stratigraphic framework model construction module, a data preprocessing module, a non-linear dimensionality reduction module, a well logging data clustering module, a primary prediction module, and an auxiliary correction module.

the while-drilling information acquiring module is configured to obtain existing well data and acquire well logging data and images imaged while drilling in real time;

the stratigraphic framework model construction module is configured to, based on the existing well data, construct an initial stratigraphic framework model;

the data preprocessing module is configured to, based on the well logging data, conduct preprocessing of eliminating abnormal values to obtain effective well logging data;

the non-linear dimensionality reduction module is configured to, based on the effective well logging data, conduct non-linear dimensionality reduction to obtain dimensionality reduction well logging data;

the well logging data clustering module is configured to, based on the dimensionality reduction well logging data, conduct non-linear clustering through a density peak clustering method to obtain well logging data clusters;

the primary prediction module is configured to, based on the well logging data cluster, obtain a marker layer primary prediction result through a marker layer prediction model based on a deep belief network;

the auxiliary correction module is configured to conduct depth correction and dipping angle and dipping direction correction on the stratigraphic framework model through the marker layer primary prediction result to obtain a corrected stratigraphic framework model and to adjust a drilling trajectory according to the corrected stratigraphic framework model.

Those skilled in the art can clearly understand that to realize convenience and conciseness of description, specific working processes, and relevant description of a storage device and a processing device in the above description can refer to corresponding processes in the above method embodiments, which are not repeated here.

The terms such as 'first', 'second', and the like are used for distinguishing similar objects, rather than describing or representing a specific sequence or a precedence order.

The term 'comprise' or any other similar term is intended to cover non-exclusive comprising, so that a process, a method, an object, or equipment/a device comprising a series of elements not only comprises those elements, but also comprises other elements that are not listed clearly, or comprise inherent elements of the process, the method, the object or the equipment/the device.

So far, the technical solution of the present disclosure is described in combination with the preferable implementation manners shown in the drawings; however, those skilled in the art easily understand that the protection scope of the present disclosure is not limited to these specific implementation manners. Those skilled in the art can make equivalent changes or replacements to the related technical features on the premise of not deviating from the principle of the present disclosure, and the technical solutions after these changes or replacements fall into the protection scope of the present disclosure.

What is claimed is:

1. A drilling trajectory updating method for a stratigraphic framework with geosteering-while-drilling, comprising:

step S100, obtaining existing well data, and acquiring well logging data and images imaged of an actual drill in real time while the actual drill is drilling;

step S200, based on the existing well data, constructing an initial stratigraphic framework model;

step S300, based on the well logging data, conducting preprocessing of eliminating abnormal values to obtain effective well logging data, specifically comprising:

eliminating the abnormal values through an isolated forest algorithm, especially comprising:

step S310, utilizing the well logging data and drilling data for permutation and combination to establish to-be processed data sets; wherein the well logging data includes acoustic log (AC), compensated neutron log (CNL), deep resistivity log (RD), shallow resistivity log (RS), conductivity log (COND), gamma ray log (GR), and density log (DEN), and the drilling data includes a drilling rate, a rotating speed, and a drilling pressure;

step S320, representing a to-be-processed data combination in each to-be-processed data set as XX= {xx1, ..., xxii, ..., xxnn}, 1≤ii≤nn, ∀xxii∈XX, xxii= (xxii1, ..., xxii10), wherein xxii represents data points, and randomly drawing φ data points from the well logging data XX to constitute a subset XX' to be stored in a root node;

step S330, randomly selecting a dimension q from the well logging data, and randomly generating a cut point p in the dimension q, wherein the cut point p satisfies $(x_{ij}, j=q, x_{ij} \in X') < p < \max(x_{ij}, j=q, x_{ij} \in X')$;

step S340, generating hyperplanes for dividing data in the dimension q into two subspaces according to the cut point p, designating to put data points with values smaller than p into a first leaf node and to put data points with values larger than or equal to p into a second leaf node;

step S350, recurring the steps S330-S340 until all leaf nodes have one data point or an isolated tree has already reached a preset height;

step S360, repeating the steps S320-S350 until T isolated trees are generated, wherein each of the T isolated trees does not have outside nodes of leaf nodes, or has two leaf nodes $\{T_l, T_r\}$ and one inside node test; the inside node test in the T isolated trees is composed of the dimension q and cut point p, and points belong to $T_l$ if q<p, or otherwise belongs to $T_r$;

step S370, enabling the T isolated trees to be an isolated tree forest; enabling each data point $x_i$ traverse each isolated tree, and calculate a height $h(x_i)$ of each data point xxii at each isolated tree, that is, the number of the edges passed by each data point $x_i$ from the root nodes to the leaf nodes of each isolated tree; and then calculating the average height of each data point $x_i$ in the isolated tree forest, and normalizing the average heights of all the data points to obtain a normalized average height $\overline{h(x_1)}$ of the data points;

step S380, based on the normalized average height $\overline{h(x_1)}$ of the data points, calculating an abnormal value score $s(x, \varphi)$:

$$s(x, \varphi) = 2^{\frac{E(\overline{h(x_i)})}{\overline{c(\varphi)}}}$$

wherein $\overline{c(\varphi)}$ represents an average of a binary tree path length constructed by $\varphi$ data points, and E(*) represents expectation;

$$\overline{c(\varphi)} = \begin{cases} 2H(\varphi-1) - \frac{2(\varphi-1)}{\varphi}, & \varphi > 2 \\ 1, & \varphi = 2 \\ 0, & \varphi < 2 \end{cases}$$

wherein H(i) represents a harmonic number and may be estimated by ln(i)+0.5772156649, and 0.5772156649 is an Euler's constant;

when the abnormal value score $s(x, \varphi)$ is smaller than a preset abnormal value threshold s, a corresponding data point is eliminated to obtain effective well logging data $Y=\{y_1, \ldots, y_\alpha, \ldots, y_m\}$, $1 \leq \alpha \leq m$, and $y_\alpha \in Y$, and m represent the number of the data points in the effective well logging data;

step S390, repeating the steps S320-380 to select a to-be-processed data combination that is never selected for calculation of effective well logging data, and selecting the effective well logging data with the accuracy rate reaching a first preset accuracy rate threshold and with the highest accuracy rate to conduct a subsequent step;

step S400, based on the effective well logging data, conducting non-linear dimensionality reduction to obtain dimensionality reduction well logging data, wherein in step S400, non-linear dimensionality reduction is conducted on the effective well logging data using a t-distributed Stochastic Neighbor Embedding (t-SNE) method, wherein the t-SNE method comprises steps S410-S430:

step S410, based on the effective well logging data $Y=\{y_1, \ldots y_\alpha, \ldots y_m\}$, selecting arbitrary points $y_\alpha$ and $y_\beta$, $1 \leq \alpha, \beta \leq m$, $y_\alpha, y_\beta \in Y$, wherein $y_\beta$ obeys Gaussian distribution $P_\alpha$ with $y_\alpha$ as a center and $\sigma_\beta$ as a variance, $y_\alpha$ obeys Gaussian distribution $P_\beta$ with $y_\beta$ as a center and $\sigma_\alpha$; and then the similar conditional probability $P_{\beta|\alpha}$ between $y_\alpha$ and $y_\beta$ is as follows:

$$P_{\beta|\alpha} = \frac{\exp(-\|y_\alpha - y_\beta\|^2/2\sigma_\alpha^2)}{\sum_{\alpha \neq b}\exp(-\|y_\alpha - y_b\|^2 2/\sigma_\alpha^2)}$$

wherein a user may designate perplexity Perp according to $\sigma_\alpha$, the perplexity is 10 defined as $Perp(P_\alpha)=2^{H(P_\alpha)}$, and $H(P_\alpha)$ represents Shannon information entropy of Gaussian distribution $P_\alpha$:

$$H(P_\alpha) = -\sum_\beta P_{\beta|\alpha}\log_2 p_{\beta|\alpha}$$

the joint probability $P_{\alpha\beta}$ of pairwise similarity for similar conditional probability between the data points $y_\alpha$ and $y_\beta$ in all the data points are as follows:

$$p_{\alpha\beta} = \frac{p_{\beta|\alpha} + p_{\alpha|\beta}}{2m}$$

wherein $p_{\alpha|\beta}$ represents the similar conditional probability between $y_\beta$ and $y_\alpha$, step S420, assuming that a dimensionality reduction well logging data set $z=\{z_1, \ldots z_\alpha, \ldots z_m\}$ is constructed based on the effective well logging data $YY=\{y_1, \ldots, y_\alpha, \ldots, y_m\}$, wherein in the step S420, the effective well logging data is data in a 20 high-dimensional space relatively to a dimensionality reduction well logging data set; and calculating the joint probability $q_{\alpha\beta}$ of corresponding simulation points $z_\alpha$ and $z_\beta$ of data points $y_\alpha$ and $y_\beta$ in the dimensionality reduction well logging data set:

$$q_{\alpha\beta} = \frac{(1 + \|z_\alpha - z_\beta\|^2)^{-1}}{\sum_{\varepsilon 1 \neq \varepsilon 2}(1 + \|z_{\varepsilon 1} - z_{\varepsilon 2}\|^2)^{-1}}$$

wherein $1 \leq \varepsilon 1$, $\varepsilon 2 \leq m$, $z_{\varepsilon 1}$ and $z_{\varepsilon 2}$ represent two different points in the dimensionality reduction well logging data set, $z_{\varepsilon 1}$, $z_{\varepsilon 2} \in Z$, and calculation of each joint probability $q_{\alpha\beta}$ traverses all two different points in the dimensionality reduction well logging data set;

step S430, based on the joint probability $P_{\alpha\beta}$ of pairwise similarity for the similar conditional probability between the data points $y_\alpha$ and $y_\beta$ in all the data points and the joint probability $q_{\alpha\beta}$ of the corresponding simulation points $z_\alpha$ and $z_\beta$ of the data points $y_\alpha$ and $y_\beta$ in the dimensionality reduction well logging data set, measuring the similarity C between probability distribution Q of the dimensionality reduction well 10 logging data set and probability distribution P of the high-dimensional space of the effective well logging data through KL divergence:

$$C = KL(P||Q) = \sum_{\alpha} \left| \sum_{\beta} p_{\alpha\beta} \log \frac{p_{\alpha\beta}}{q_{\alpha\beta}} \right|$$

wherein the smaller the value of the similarity C is, the higher the simulation correctness of the simulation points of the dimensionality reduction well logging data set is;

the KL divergence takes a minimum value through a gradient-descent algorithm:

$$\frac{\delta C}{\delta z_{\alpha}} = 4 \sum_{\beta} (p_{\alpha\beta} - q_{\alpha\beta})(z_{\alpha} - z_{\beta})(1 + \|z_{\alpha} - z_{\beta}\|^2)^{-1}$$

a dimensionality reduction well logging data set is obtained $ZZ=\{z_1, \ldots, z_{\alpha}, \ldots, z_m\}$;

previous two dimensions in the dimensionality reduction well logging data set dimensionality reduction are kept, and the rest dimensions are deleted to obtain dimensionality reduction well logging data $\hat{Z}=\{\hat{z}_1, \ldots, \hat{z}_{\alpha}, \ldots, \hat{z}_m\}$, that is, the dimensionality reduction well logging data set in two dimensions, which can explain more contents, can be selected;

step S500, based on the dimensionality reduction well logging data, conducting non-linear clustering through a density peak clustering method, and conducting interactive quantitative evaluation in combination with cores and well logging with imaging-while-drilling to obtain a labeled well logging data cluster, specifically comprising:

Step S510, calculating Euclidean distance $d_{\alpha\beta}$ between all data points in the dimensionality reduction well logging data;

$$d_{\alpha\beta} = d[(\hat{z}_{\alpha 1}, \hat{z}_{\alpha 2}), (\hat{z}_{\beta 1}, \hat{z}_{\beta 2})] = \left( \sum_{e=1}^{2} |\hat{z}_{\alpha e} - \hat{z}_{\beta e}|^2 \right)^{1/2}$$

wherein e represents a dimension of the dimensionality reduction well logging data;

step S520, according to the demand on the clustering number, setting a cutoff distance dc;

step S530, calculating a density $\rho_{\alpha}$ of each node based on the cutoff distance:

$$\rho_{\alpha} = \sum_{\beta \neq \alpha} e^{-\left(\frac{d_{\alpha\beta}}{dc}\right)^2}$$

wherein $\rho_{\alpha}$ represents the number of nodes, from which to a node ii, the distance is smaller than dc;

step S540, calculating a relative distance da between the nodes:

$$\delta_{\alpha} = \begin{cases} \max(d_{\alpha\beta}), & \rho_{\alpha} > \rho_{\beta} \\ \min(d_{\alpha\beta}), & \rho_{\alpha} \leq \rho_{\beta} \end{cases}$$

step S550, with the density $\rho_{\alpha}$ as an abscissa and the relative distance $\delta_{\alpha}$ as an ordinate, drawing a two-dimensional diagram, determining a point in the clustering center, and grouping all the data points into closest data points with the density larger than those of the above data points to obtain a well logging data cluster; and step S560, based on the well logging data cluster, through a feature chart based on marker layers, conducting an interactive quantitative evaluation on the well logging data cluster by applying a core at a corresponding depth and well logging with imaging-while-drilling, to obtain a labeled well logging data cluster;

step S600, based on the well logging data cluster, obtaining a marker layer primary prediction result through a marker layer prediction model based on a deep belief network; and step S700, conducting depth correction and dipping angle and dipping direction correction on the stratigraphic framework model through the marker layer primary prediction result to obtain a corrected stratigraphic framework model and adjusting a drilling trajectory of the actual drill according to the corrected stratigraphic framework model.

2. The drilling trajectory updating method for the stratigraphic framework with geosteering-while-drilling according to claim 1, wherein depth correction especially comprises:

according to the marker layer primary prediction result, determining primary prediction positions of boundaries of the marker layers, and obtaining images with imaging-while-drilling containing the upper boundaries and the lower boundaries of the marker layers;

acquiring accurate depths of the upper boundaries and the lower boundaries of the marker layers from the images with imaging-while-drilling containing the upper boundaries and the lower boundaries of the marker layers through a full convolutional neural network, and then conducting depth correction on the stratigraphic framework model.

3. The drilling trajectory updating method for the stratigraphic framework with geosteering-while-drilling according to claim 2, wherein dipping angle and dipping direction correction especially comprises:

based on a mapping relationship between the images with imaging-while-drilling and a dipping angle and a dipping direction of a stratum, calculating the dipping angle and the dipping direction of the stratum according to curvature and a peak value of an interface between marker layers, wherein a dipping angle α of the stratum relative to a drilled well is equal to Tan−1 (lower peak depth-upper peak depth)/well diameter, and a dipping direction of the stratum relative to the drilled well is an orientation corresponding to a lower peak; and in combination with real-time dipping angle and dipping direction of drilling equipment, correcting the dipping angle and the dipping direction of the stratigraphic framework model.

4. The drilling trajectory updating method for the stratigraphic framework with geosteering-while-drilling according to claim 1, wherein the method further comprises:

step S800, based on the images with imaging-while-drilling, extracting a fracture image through a fracture image extraction model based on an optimized convolutional neural network, calculating the dipping angle and the dipping direction from the fracture image according to the curvature and the peak value of an interface between marker layers, and adding the dipping angle and the dipping direction in the corrected stratigraphic framework model to obtain a perfect stratigraphic framework model, wherein the fracture image extraction model based on the convolutional neural network is an n-channel image recognition network, comprising 2n convolutional layers and 2n average pooling layers; various channels are a first convolutional layer, a first average pooling layer, a second convolutional layer, and a second average pooling layer which are connected in sequence; scales of various convolutional layers are different; in the fth channel, the first convolutional layer is (4*f−1)*(4*f−1), and the second convolutional 10 layer is (4*f+4)*(4*f+4); the sizes of various pooling layers are the same, being 2*2; and one fully connected layer and one Naive Bayes decider are collectively connected after all the channels.

5. The drilling trajectory updating method for the stratigraphic framework with geosteering-while-drilling according to claim 4, wherein the step S800 especially comprises:

step S810, based on the images with imaging-while-drilling, extracts different scales of fracture features through the first convolutional layers, the first average pooling layers, the second convolutional layers, and the second average pooling layers of different channels of the fracture image extraction model based on the optimized convolutional neural network;

step S820, combining different scales of fracture features into a comprehensive fracture feature through the fully connected layer;

step S830, rapidly extracting a fracture image from the comprehensive fracture feature through the Naive Bayes decider;

step S840, calculating the dipping angle and the dipping direction of the stratum according to curvature and a peak value of a fracture, wherein a dipping angle β of the fracture relative to the drilled well is equal to Tan−1 (lower peak depth-upper peak depth)/well diameter, and a dipping direction of the fracture relative to the drilled well is an orientation corresponding to a lower peak;

and in combination with real-time dipping angle and dipping direction of drilling equipment, correcting the dipping angle and the dipping direction of the fracture to obtain a corrected fracture image;

step S850, adding the corrected fracture image in the corrected stratigraphic framework model to obtain the perfect stratigraphic framework model.

* * * * *